United States Patent
Ten Kate et al.

(10) Patent No.: US 9,632,435 B2
(45) Date of Patent: *Apr. 25, 2017

(54) LITHOGRAPHIC APPARATUS AND METHOD

(75) Inventors: Nicolaas Ten Kate, Almkerk (NL); Johannes Henricus Wilhelmus Jacobs, Heeze (NL); Joost Jeroen Ottens, Veldhoven (NL); Bastiaan Andreas Wilhelmus Hubertus Knarren, Nederweert-Eind (NL); Thibault Simon Mathieu Laurent, Eindhoven (NL); Robbert Jan Voogd, Neerpelt (BE); Giovanni Francisco Nino, Maastricht (NL); Johan Gertrudis Cornelis Kunnen, Weert (NL); Marinus Jan Remie, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 200 days.

This patent is subject to a terminal disclaimer.

(21) Appl. No.: 13/046,211

(22) Filed: Mar. 11, 2011

(65) Prior Publication Data

US 2011/0222032 A1 Sep. 15, 2011

Related U.S. Application Data

(60) Provisional application No. 61/313,410, filed on Mar. 12, 2010, provisional application No. 61/354,126, (Continued)

(51) Int. Cl.
G03B 27/52 (2006.01)
G03B 27/58 (2006.01)
G03F 7/20 (2006.01)

(52) U.S. Cl.
CPC ........ *G03F 7/70875* (2013.01); *G03F 7/7085* (2013.01)

(58) Field of Classification Search
CPC .... G03F 7/707; G03F 7/7085; G03F 7/70875; G03F 7/708; G03F 7/7095
(Continued)

(56) References Cited

U.S. PATENT DOCUMENTS 4,503,335 A * 3/1985 Takahashi ............... 250/548
4,509,852 A 4/1985 Tabarelli et al.
(Continued)

FOREIGN PATENT DOCUMENTS

CN 1033503 6/1989
CN 1991591 7/2007
(Continued)

OTHER PUBLICATIONS

Chinese Office Action dated Dec. 3, 2012 in corresponding Chinese Patent Application No. 201110060027.6.
(Continued)

*Primary Examiner* — Christina Riddle
(74) *Attorney, Agent, or Firm* — Pillsbury Winthrop Shaw Pittman LLP

(57) ABSTRACT

A lithographic apparatus is disclosed that includes a substrate table configured to support a substrate on a substrate supporting area and a heater and/or temperature sensor on a surface adjacent the substrate supporting area.

26 Claims, 16 Drawing Sheets

Related U.S. Application Data filed on Jun. 11, 2010, provisional application No. 61/384,666, filed on Sep. 20, 2010, provisional application No. 61/416,142, filed on Nov. 22, 2010.

(58) Field of Classification Search
USPC .............. 355/30, 52, 53, 55, 72–74, 77; 250/492.1, 492.2, 492.22, 548; 430/5, 8, 430/22, 30, 311, 312, 321
See application file for complete search history.

(56) References Cited

U.S. PATENT DOCUMENTS

| | | | |
|---|---|---|---|
| 5,220,171 A * | 6/1993 | Hara et al. | 250/443.1 |
| 5,231,291 A * | 7/1993 | Amemiya et al. | 250/443.1 |
| 5,746,513 A | 5/1998 | Renken | |
| 5,929,689 A | 7/1999 | Wall | |
| 5,967,661 A | 10/1999 | Renken et al. | |
| 6,190,040 B1 | 2/2001 | Renken et al. | |
| 6,325,536 B1 | 12/2001 | Renken et al. | |
| 6,616,332 B1 | 9/2003 | Renken et al. | |
| 7,304,715 B2 | 12/2007 | Cadee et al. | |
| 7,352,435 B2 | 4/2008 | Streefkerk et al. | |
| 7,525,640 B2 | 4/2009 | Jansen et al. | |
| 7,532,310 B2 | 5/2009 | Mertens et al. | |
| 7,804,575 B2 | 9/2010 | Cadee et al. | |
| 8,064,151 B2 | 11/2011 | Jansen et al. | |
| 8,228,487 B2 | 7/2012 | Rijpma et al. | |
| 8,982,316 B2 | 3/2015 | Lexmond et al. | |
| 2003/0173346 A1 | 9/2003 | Renken | |
| 2004/0031340 A1 | 2/2004 | Renken | |
| 2004/0136494 A1 | 7/2004 | Lof et al. | |
| 2004/0154417 A1 | 8/2004 | Renken et al. | |
| 2004/0207824 A1 | 10/2004 | Lof et al. | |
| 2005/0081398 A1 | 4/2005 | Sun et al. | |
| 2005/0174550 A1 | 8/2005 | Streefkerk et al. | |
| 2005/0213067 A1 | 9/2005 | Van Der Feltz et al. | |
| 2005/0230637 A1 | 10/2005 | Fukushima et al. | |
| 2005/0267606 A1 | 12/2005 | Bartlett, Jr. et al. | |
| 2005/0286033 A1 * | 12/2005 | Lin et al. | 355/53 |
| 2006/0015294 A1 | 1/2006 | Yetter, Jr. et al. | |
| 2006/0033892 A1 | 2/2006 | Cadee et al. | |
| 2006/0033898 A1 * | 2/2006 | Cadee et al. | 355/53 |
| 2006/0038968 A1 | 2/2006 | Kemper et al. | |
| 2006/0082744 A1 * | 4/2006 | Hirukawa | 355/30 |
| 2006/0102849 A1 * | 5/2006 | Mertens et al. | 250/440.11 |
| 2006/0119809 A1 | 6/2006 | Verhagen et al. | |
| 2006/0158627 A1 | 7/2006 | Kemper et al. | |
| 2006/0285096 A1 | 12/2006 | Jacobs et al. | |
| 2007/0153244 A1 * | 7/2007 | Maria Zaal et al. | 355/30 |
| 2007/0251338 A1 | 11/2007 | Wiese et al. | |
| 2008/0011737 A1 | 1/2008 | Fukuoka et al. | |
| 2008/0087069 A1 | 4/2008 | Renken et al. | |
| 2008/0123066 A1 | 5/2008 | Jansen et al. | |
| 2008/0137055 A1 | 6/2008 | Hennus et al. | |
| 2008/0224817 A1 | 9/2008 | Vellore et al. | |
| 2008/0297744 A1 | 12/2008 | De Jong et al. | |
| 2009/0046260 A1 | 2/2009 | Jansen | |
| 2009/0056441 A1 | 3/2009 | Sun et al. | |
| 2009/0161286 A1 | 6/2009 | Steger et al. | |
| 2009/0207392 A1 * | 8/2009 | Rijpma et al. | 355/30 |
| 2009/0279061 A1 | 11/2009 | Jacobs et al. | |
| 2009/0316121 A1 | 12/2009 | Janssen et al. | |
| 2010/0014060 A1 | 1/2010 | Lexmond et al. | |

FOREIGN PATENT DOCUMENTS

| | | |
|---|---|---|
| CN | 101098571 | 1/2008 |
| CN | 101178547 | 5/2008 |
| EP | 1 420 300 | 5/2004 |
| EP | 1 873 816 | 1/2008 |
| JP | 2-005384 | 1/1990 |
| JP | H02-223183 | 9/1990 |
| JP | 3-019316 | 1/1991 |
| JP | H07-270122 | 10/1995 |
| JP | H11-339937 | 12/1999 |
| JP | 2000-187514 | 7/2000 |
| JP | 2002-36373 | 2/2002 |
| JP | 2002-202204 | 7/2002 |
| JP | 2003-243133 | 8/2003 |
| JP | 2003-324028 | 11/2003 |
| JP | 2005-252247 | 9/2005 |
| JP | 2006-054468 | 2/2006 |
| JP | 2007-005362 | 1/2007 |
| JP | 2008-235930 | 10/2008 |
| JP | 2009-076940 | 4/2009 |
| JP | 2009-081419 | 4/2009 |
| JP | 2009-105443 | 5/2009 |
| JP | 2009-162603 | 7/2009 |
| JP | 2009-200486 | 9/2009 |
| JP | 2009-536452 | 10/2009 |
| JP | 2009-272631 | 11/2009 |
| JP | 2009-281945 | 12/2009 |
| JP | 2010-004037 | 1/2010 |
| JP | 2010-004039 | 1/2010 |
| KR | 2006-0133917 | 12/2006 |
| WO | 99/49504 | 9/1999 |
| WO | 2005/064405 | 7/2005 |
| WO | 2006/112436 | 10/2006 |
| WO | 2008/005871 | 1/2008 |
| WO | 2010/015511 | 2/2010 |

OTHER PUBLICATIONS

Chinese Office Action dated Dec. 13, 2012 in corresponding Chinese Patent Application No. 201110060026.1.
Japanese Office Action mailed Apr. 8, 2013 in corresponding Japanese Patent Application No. 2011-049270.
U.S. Office Action dated Oct. 10, 2013 in corresponding U.S. Appl. No. 13/046,283.
U.S. Office Action dated Jun. 5, 2014 in corresponding U.S. Appl. No. 13/046,283.
Singapore Search and Examination Report dated Dec. 16, 2013 in corresponding Singapore Patent Application No. 201101715-9.
U.S. Office Action dated Jan. 15, 2015 in corresponding U.S. Appl. No. 13/046,283.
Japanese Office Action mailed Apr. 1, 2015 in corresponding Japanese Patent Application No. 2014-101124.
U.S. Office Action dated Jul. 30, 2015 in corresponding U.S. Appl. No. 13/046,283.
Taiwan Office Action dated Apr. 26, 2016 in corresponding Taiwan Patent Application No. 103133366.
Japanese Office Action mailed Nov. 21, 2016 in corresponding Japanese Patent Application No. 2016-048567.

* cited by examiner

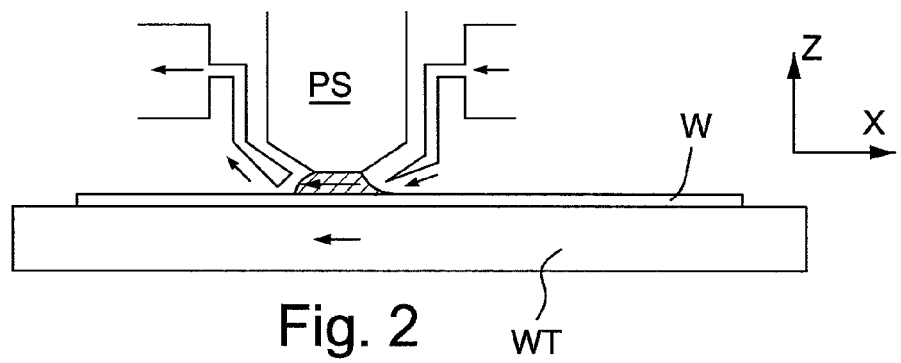
Fig. 2
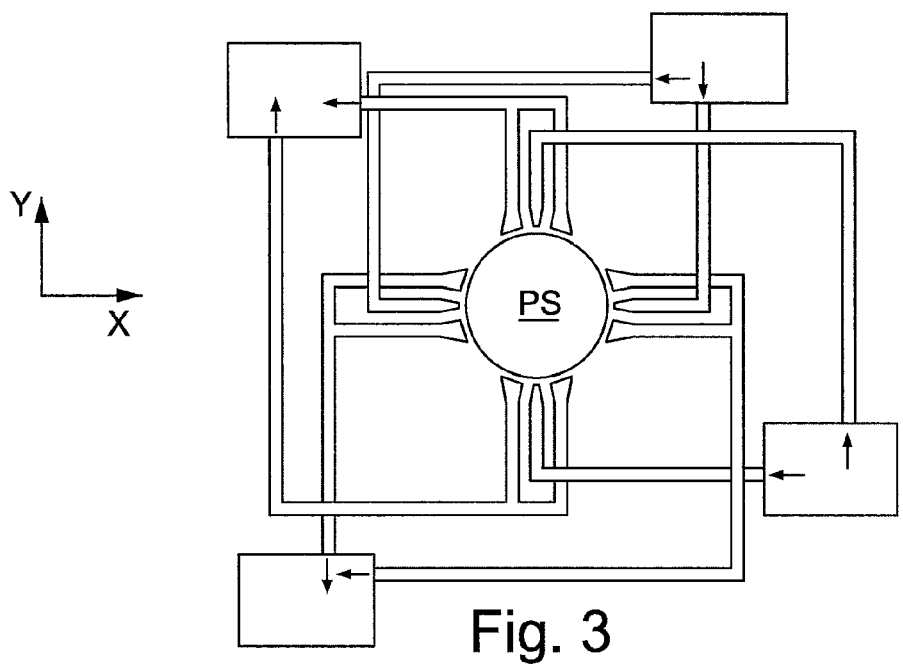
Fig. 3
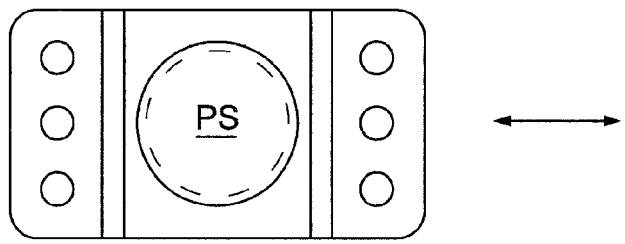
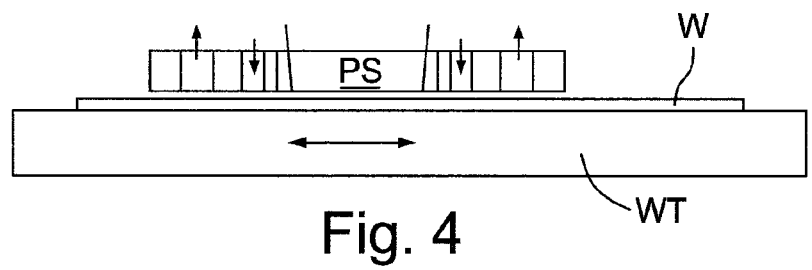
Fig. 4

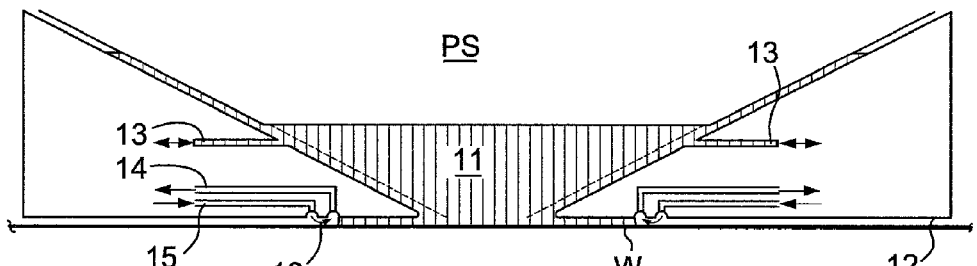
Fig. 5
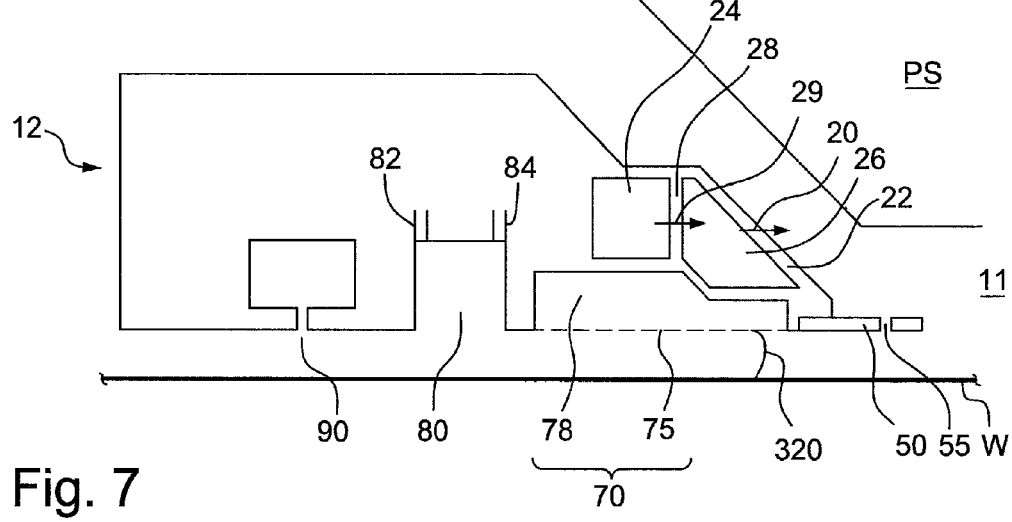
Fig. 6
Fig. 7
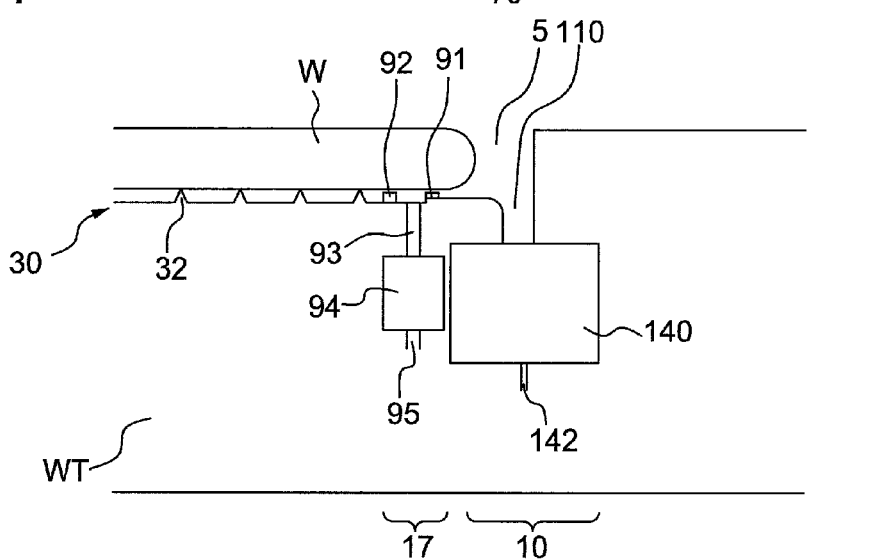

LITHOGRAPHIC APPARATUS AND METHOD

This application claims priority and benefit under 35 U.S.C.§119(e) to U.S. Provisional Patent Application No. 61/313,410, entitled "Lithographic Apparatus and Method", filed on Mar. 12, 2010, to U.S. Provisional Patent Application No. 61/354,126, entitled "Lithographic Apparatus and Method", filed on Jun. 11, 2010, to U.S. Provisional Patent Application No. 61/384,666, entitled "Lithographic Apparatus and Method", filed on Sep. 20, 2010, and to U.S. Provisional Patent Application No. 61/416,142, entitled "Lithographic Apparatus and Method", filed on Nov. 22, 2010. The content of each of the foregoing application s is incorporated herein in its entirety by reference.

FIELD

The present invention relates to a lithographic apparatus and a method of compensating for local heat load variations.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

SUMMARY

Because of the presence of liquid on the substrate in an immersion lithographic apparatus, evaporational heat loads can result on one or more components which come into contact with immersion liquid (e.g. the substrate and/or substrate table). These heat loads can lead to thermal expansion and/or contraction. Such thermal expansion and/or contraction can lead to imaging errors, in particular overlay errors.

It is desirable, for example, to provide an apparatus in which the occurrence of thermal expansion/contraction effects are reduced. In particular it is desirable to provide a system configured to reduce thermal expansion/contraction effects in an immersion system which uses a supply system which provides immersion fluid to a localized area of the substrate and/or substrate table.

According to an aspect of the invention, there is provided a lithographic apparatus comprising: a heater and/or temperature sensor on a surface.

According to an aspect of the invention, there is provided a substrate table configured to support a substrate on a substrate supporting area, the substrate table comprising a plurality of heaters and/or temperature sensors adjacent a central portion of the substrate supporting area, the plurality of heaters and/or sensors being elongate.

According to an aspect of the invention, there is provided a lithographic apparatus comprising: a substrate table configured to support a substrate on a substrate supporting area and comprising a heater and/or a temperature sensor which extends across the substrate supporting area from one edge to an opposite edge.

According to an aspect of the invention, there is provided a lithographic apparatus, wherein the surface is a surface on a substrate table configured to support a substrate on a substrate supporting area which is: adjacent the substrate supporting area, or adjacent a sensor or adjacent a swap bridge.

According to an aspect of the invention, there is provided a substrate table configured to support a substrate on a substrate supporting area and a heater and/or temperature sensor on a surface adjacent the substrate supporting area.

According to an aspect of the invention, there is provided a method of compensating for a local heat load in an immersion lithographic projection apparatus the method comprising: controlling a heater or using a signal from a temperature sensor to compensate for a local heat load wherein the heater and/or temperature sensor is on a surface.

According to an aspect of the invention, there is provided a lithographic apparatus comprising an electrically conductive coating on a surface, and a heater and/or temperature sensor connected to the coating.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 5 depicts, in cross-section, a barrier member which may be used in an embodiment of the present invention as a liquid supply system;

FIG. 6 illustrates, in cross-section, another barrier member which may be used in an embodiment of the present invention;

FIG. 7 illustrates, in cross-section, a portion of a substrate table surrounding the edge of a substrate;

DETAILED DESCRIPTION

Figure 1:
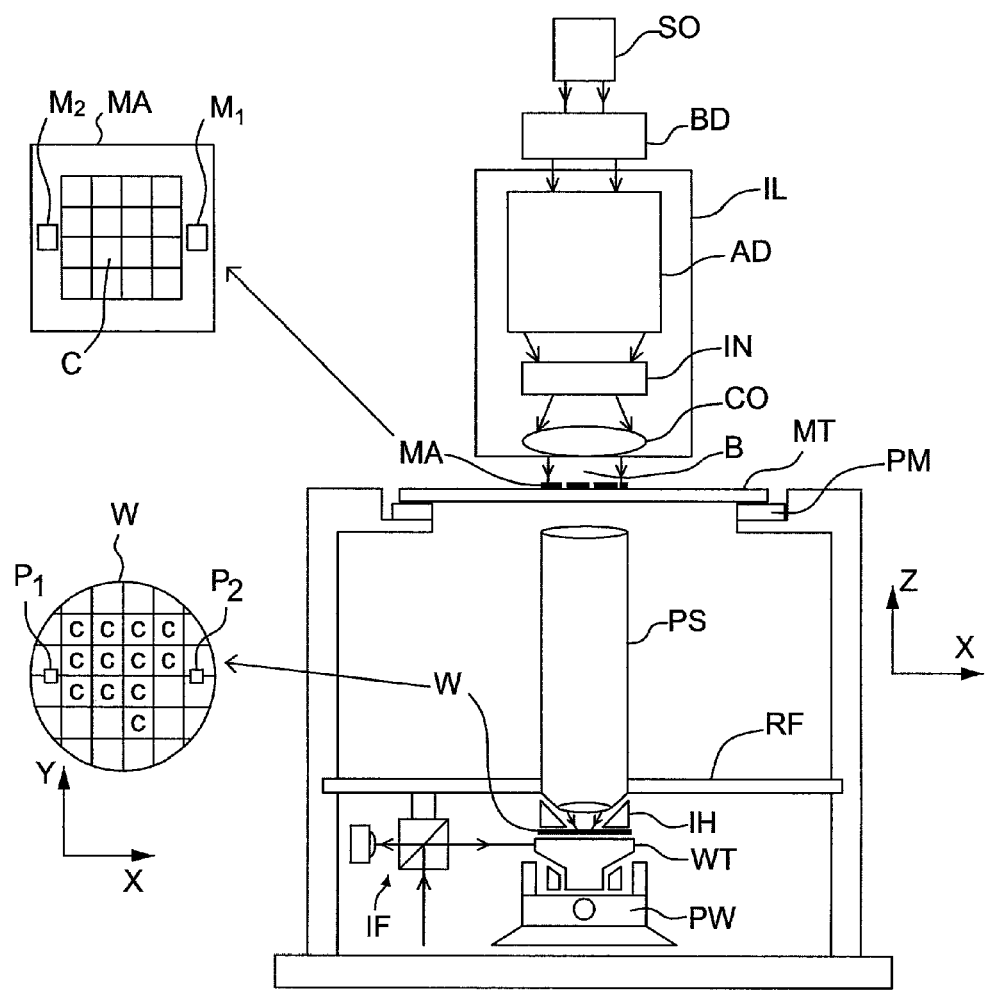
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a barrier member 12, IH. The barrier member extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the barrier member 12 positioned below and surrounding the final element of the projection system PS. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, an embodiment of the present invention may use any type of localized liquid supply system. An embodiment of the invention is particularly relevant to use with any localized liquid supply systems as the liquid supply system.

FIG. 6 illustrates a barrier member 12 which is part of a liquid supply system. The barrier member 12 extends around the periphery (e.g., circumference) of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped. The barrier has an opening through which the projection beam may pass out from the final element of the projection system PS. Thus, during exposure, the projection beam may pass through liquid contained in the opening of the barrier member and onto the substrate W.

The function of the barrier member 12 is at least partly to maintain or confine liquid in the space between the projection system PS and the substrate W so that the projection beam may pass through the liquid. The top level of liquid is simply contained by the presence of the barrier member 12.

The immersion liquid is provided to the space 11 by the barrier member 12 (thus the barrier member may be considered to be a fluid handling structure). A passageway or flow path for immersion liquid passes through the barrier member 12. Part of the flow path is comprised by a chamber 26. The chamber 26 has two side walls 28, 22. Liquid passes through the first side wall 28 into chamber 26 from chamber or outlet 24 and then through the second side wall 22 into the space 11. A plurality of outlets 20 provide the liquid to the space 11. The liquid passes through through holes 29, 20 in side walls 28, 22 respectively prior to entering the space 11. The location of the through holes 20, 29 may be random.

A seal is provided between the bottom of the barrier member 12 and the substrate W. In FIG. 6 a seal device is configured to provide a contactless seal and is made up of several components. Radially outwardly from the optical axis of the projection system PS, there is provided a (optional) flow control plate 50 which extends into the space (though not into the path of the projection beam) which helps maintain substantially parallel flow of the immersion liquid out of outlet 20 across the space. The flow control plate 50 has through holes 55 in it to reduce the resistance to movement in the direction of the optical axis of the barrier member 12 relative to the projection system PS and/or substrate W.

Radially outwardly of the flow control plate 50 on the bottom surface of the barrier member 12 may be an extractor assembly 70 to extract liquid from between the barrier member 12 and the substrate W and/or the substrate table WT. The extractor may operate as a single phase or as a dual phase extractor.

Radially outwardly of the extractor assembly 70 may be a recess 80. The recess is connected through an inlet 82 to the atmosphere. The recess is connected via an outlet 84 to a low pressure source. Radially outwardly of the recess 80 may be a gas knife 90. An arrangement of the extractor, recess and gas knife is disclosed in detail in United States patent application publication no. US 2006/0158627.

The extractor assembly 70 comprises a liquid removal device or extractor or inlet such as the one disclosed in United States patent application publication no. US 2006-0038968. Any type of liquid extractor may be used. In an embodiment, the extractor assembly or liquid removal device 70 comprises an inlet which is covered in a porous material 75 which is used to separate liquid from gas to enable single-liquid phase liquid extraction. A chamber 78 downstream of the porous material 75 is maintained at a slight under pressure and is filled with liquid. The under pressure in the chamber 78 is such that the meniscuses formed in the holes of the porous material prevent ambient gas from being drawn into the chamber 78 of the extractor assembly 70. However, when the porous surface 75 comes into contact with liquid there is no meniscus to restrict flow and the liquid can flow freely into the chamber 78 of the extractor assembly 70.

During use (e.g., during the time that the substrate moves under the barrier member 12 and projection system PS), a meniscus 320 extending between the substrate W and the barrier member 12 is provided.

Although not specifically illustrated in FIG. 6, the liquid supply system has an arrangement to deal with variations in the level of the liquid. This is so that liquid which builds up between the projection system PS and the barrier member 12 can be dealt with and does not spill.

A substrate W is normally positioned in a recess (e.g. a substrate supporting area) within the substrate table WT. In order to account for variations in the width (e.g., diameter) of the substrate W, the recess is usually made a little larger than the maximum likely size of the substrate W. Therefore there exists a gap between the edge of the substrate and the substrate table W. With all arrangements for providing liquid, there may be a difficulty in the treatment of the gap 5 between the substrate and the substrate table. This is because liquid can enter this gap 5. It is desirable to remove liquid from the gap 5 to prevent it from working its way under the substrate. It is also desirable to prevent bubbles of gas entering the immersion liquid from the gap 5. For this purpose an inlet may be provided below the gap between the edge of the substrate and substrate table. The inlet is connected to an underpressure source so that liquid and/or gas can be removed from the gap 5.

FIG. 7 is a schematic cross-section through a substrate table WT and a substrate W. The gap 5 exists between an edge of the substrate W and an edge of the substrate table WT. The gap 5 is at an outer area or edge of a recess in which the substrate is placed during imaging. The substrate W can be supported on a substrate supporting area of the substrate table WT.

In order to deal with the liquid entering that gap, at least one drain 10, 17 may be provided at the edge of the substrate W to remove any liquid which enters the gap 5. In the embodiment of FIG. 7, two drains 10, 17 are illustrated though there may be only one drain or there could be more than two drains.

The primary function of the first drain 10 is to prevent bubbles of gas from entering the liquid 11 of the liquid supply system 12. Any such bubbles can deleteriously affect the imaging of the substrate W. The second drain 17 may be provided to prevent any liquid which finds its way from the gap 5 to underneath the substrate W from preventing efficient release of the substrate W from the substrate table WT after imaging. As is conventional, the substrate W is held by a pimple table or burl plate 30 comprising a plurality of projections 32 called burls. An underpressure applied between the substrate W and the substrate table WT by the pimple table 30 ensures that the substrate W is held firmly in place. The provision of the second drain 17 under the pimple table 30 reduces or eliminates problems which may occur due to liquid finding its way underneath the substrate W.

The first drain 10 removes liquid by way of an underpressure. That is, the first drain 10 is connected via outlet 142 to an underpressure source. This underpressure source effectively removes any liquid which enters the drain.

The exact geometry of the first drain 10 is not important. Typically the first drain 10 comprises an inlet 110 which puts a chamber 140 into fluid communication with the gap 5. The chamber 140 may be annular, for example. The outlet(s) 142 is in fluid communication with the chamber 140.

The second drain 17 will now be described. An outlet 95 of the second drain 17 is held at an under pressure (e.g. 0.6 bar) which is a little larger than the under pressure (e.g. 0.5 bar) of the pimple table 30. This ensures that there is a flow of gas from the pimple table 30 as well as from the gap 5 to the outlet 95. In an alternative embodiment, the second drain 17 can be held at an over pressure. In this case there is a flow of gas out of the outlet 95 towards the gap 5. Combined with capillary pressure this can be used to reduce or prevent immersion liquid getting into the pimple table 30.

As can be seen, two projections 91 and 92 are provided underneath the substrate W. The radially outer projection 91 is a so-called "wet seal" and is likely to have immersion liquid passing between it and the bottom surface of the substrate W. The radially inner projection 92 is a dry seal and only gas is likely to pass between it and the substrate W.

Between the two projections 91, 92 is a channel 93 which leads to a chamber 94. The chamber 94 is in fluid communication with the outlet 95 which is connected to the under pressure source. More detail of this second drain 17 and of the first drain 10 can be found in United States patent application publication no. US 2008-0297744.

If gas is removed through the gap then this may lead to undesirable evaporation of any liquid in the gap 5. This can in turn lead to localized cooling. Localized cooling is undesirable because it may lead to thermal contraction of the substrate table and thereby to possible overlay errors.

One way in which this phenomenon may be dealt with is to provide a channel for a heat transfer fluid in the substrate table WT. The temperature of the substrate table can be maintained constant in this way. Additionally, as disclosed in United States patent publication no. US 2008-0137055, a further heater may be used to heat in the vicinity of the inlet. Therefore the extra thermal load which is generated at that point may be compensated for by the use of that further heater.

Figure 8:
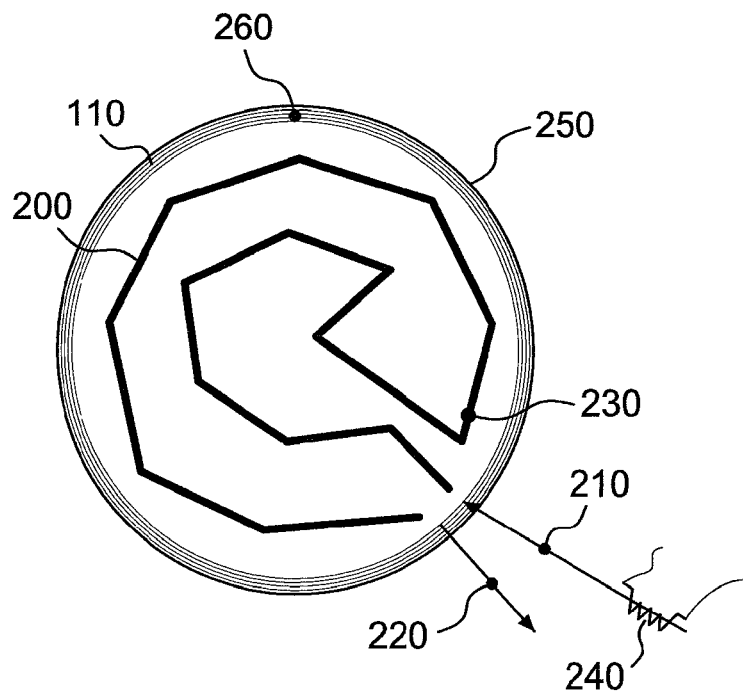
FIG. 8 illustrates, in plan, a central section of a substrate table.

FIG. 8 illustrates one such arrangement. FIG. 8 is a plan view of the substrate support area of a substrate table WT. The inlet 110 is indicated. A central channel 200 for heat transfer fluid is provided. The central channel 200 follows a path under the position of the substrate W. The path of the central channel 200 is such that an even heating can be applied by passing a heating fluid through the channel 200. The temperature of the heat transfer fluid entering the channel 200 is detected by a first temperature sensor 210. The temperature of heat transfer fluid exiting the channel 200 is to detected by a second temperature sensor 220. A third temperature sensor 230 may be provided in the channel 200 to detect the temperature at a local point. A controller can be provided with data from the temperature sensors 210, 220, 230 and can control the temperature of the heat transfer fluid using a heater 240 which is used to heat heat transfer fluid prior to the heat transfer fluid entering the channel 200.

In order to deal with the excessive cooling which can be generated by the drain 10, a heating element 250 may be provided. The heating element 250 is a single heating element which is adjacent the inlet 110 and extends around the periphery (e.g., circumference) of the inlet 110.

The heating element 250 may be positioned underneath the chamber 140 or on either side of the chamber 140, as illustrated in FIG. 7. There may be other appropriate positions for the heater 250.

A fourth temperature sensor 260 is provided. The fourth temperature sensor 260 is provided in the vicinity of the inlet 110. A controller can use the information obtained from the fourth temperature sensor 260 to control the power applied to the heating element 250.

Although the system illustrated in FIG. 8 does alleviate some difficulties, particularly when a localized area liquid supply system is used, the cooling around the periphery of the inlet 110 is not necessarily uniform. Therefore the position of the fourth temperature sensor 260 is significant. If the fourth temperature sensor 260 is in a position which has experienced a large amount of local cooling, then although that cooling may be compensated, other areas of the inlet 110 may be heated too much. The difficulty with sensor 260 means that it may be better to control the heating element 250 based on the temperature difference between the second and third temperature sensors 220 and 230. The controller uses this difference as a measure of the thermal load on the substrate table edge. If on a part of the total periphery of the substrate table a thermal load is applied, the balancing heat load is applied over the total periphery. As a result the heating element undercompensates the loaded area and disturbs the unloaded area. If for instance 1 W is over $\frac{1}{3}^{rd}$ of the substrate table edge, this is compensated with 1 W over the total edge. So, only 0.33 W of that localized load is compensated, the other 0.66 W is disturbing the rest of the edge. Even by the provision of further temperature sensors around the inlet 110, this problem may not be alleviated.

The solution of FIG. 8 has the following short-comings: 1) the heater-sensor combination reaction time is too slow (long time constant). The heaters and sensors are glued to the substrate table WT resulting in relatively high contact resistances. 2) The heaters and sensors are only applied at the substrate table edge and not to its core (central portion), which provides a partial solution. 3) Water conditioning is limited to a maximum flow which leads to a non-uniform temperature distribution. Because the water channel is small in cross-section and rather long the flow resistance is high. For high flows the pressure drop becomes too large, leading to non-uniform mechanical deformations of the wafer table itself. High flows also lead to high velocities and high dynamic forces, which lead to uncorrectable disturbance forces. Any flow (not only the maximum flow) leads to a non-uniform temperature distribution. The water cools down from inlet to outlet. This temperature difference results in non-uniformity. The higher the flow the lower the dT, of course. 4) Water conditioning can lead to uncorrectable dynamic disturbances because of pressure pulses. 5) Water conditioning involves a 'thick' (10 mm), and therefore heavy substrate table WT causing scan-up-scan-down problems.

In an embodiment heaters 400 and/or temperature sensors 500 are on a surface of the substrate table WT. The heaters 400 and/or temperature sensors 500 may be on a surface adjacent (e.g. under) the substrate supporting area. One such surface is a surface of a burl plate 600.

Figure 9:
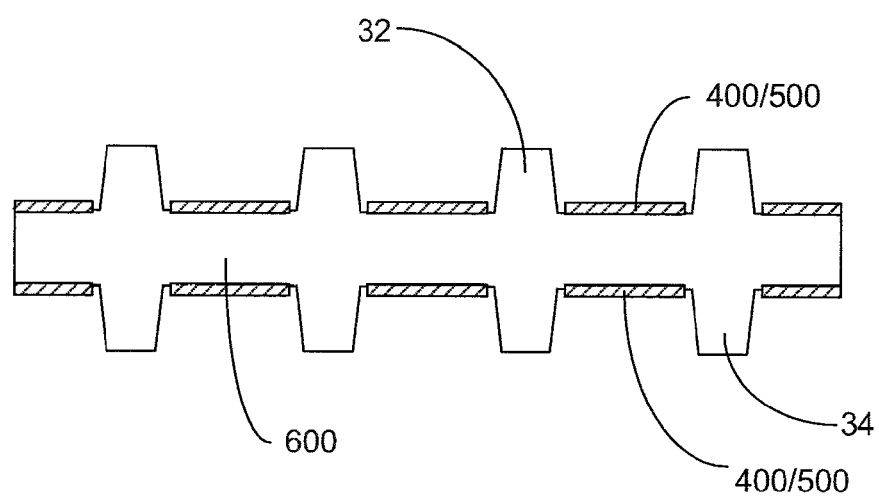
FIG. 9 illustrate, in cross-section, a burl plate showing the location of heaters and/or temperature sensors.

A burl plate 600 of an embodiment is illustrated in FIG. 9. The burl plate 600 is comprised of a plate with projections on an upper surface and on a lower surface. The projections on the upper surface are burls 32 on which the substrate W, in use, is supported. The burls 34 on the underside are for supporting the burl plate 600 on a surface of the substrate table WT.

In FIG. 7 the burl plate 30 is shown as an integral part of the substrate table WT and no burls equivalent to burls 34 or FIG. 9 are present.

In FIG. 9 the heater 400 and/or temperature sensor 500 are on a surface of the burl plate 600, formed between the burls 32, 34. The heater 400 and/or temperature sensor 500 may be on a upwardly facing surface and/or on a downwardly facing surface of the burl plate 600.

In one embodiment the heater 400 and/or temperature sensor 500 are formed as a thin film. Therefore the heater 400 and/or temperature sensor 500 are attached directly to the surface without the use of an adhesive such as glue or solder etc. Thus the heater 400 and/or temperature sensor 500 are directly bonded to the surface, for example deposited on the surface. In one embodiment the heater 400 and/or temperature sensor 500 are formed of platinum. If the burl plate 600 is made of a conductive material (such as SiSiC), an insulating layer and/or a bonding layer may be deposited before the platinum heater 400 and/or temperature sensor 500 is deposited. It may be necessary additionally to coat the heater 400 and/or temperature sensor 500 (with another dielectric layer) once it has been deposited in order to ensure electrical isolation of the heater 400 and/or temperature sensor 500 and protection from moist gas which might otherwise create a short circuit. In an embodiment an additional insulating layer is provided over the heater 400 and/or temperature sensor 500 so heat goes into the surface. This results in more directing of heat into the body (e.g. burl plate 600).

Normally the thin films have 4 layers in total. On top of the substrate table (e.g. burl plate 600) there is a bonding layer, then an isolating dielectric layer, then the platinum layer and then again a dielectric layer on top to avoid short-circuiting. To avoid electro-magnetic interference of the platinum lines there may be 2 extra shielding layers. The heaters and/or temperature sensors are thin, say below 100 µm, preferably below 10 µm or even 1 µm thick.

The heater 400 and/or temperature sensor 500 are positioned adjacent the substrate supporting area. Because they are bonded directly to the surface, heat is conducted to/from the heater 400 and/or temperature sensor 500 to the material behind the surface quickly. If the surface to which the heater 400 and/or temperature sensor 500 are applied is the burl plate, the transfer of heat to/from the substrate W is extremely quick because of their proximity to the substrate W.

Figure 10:
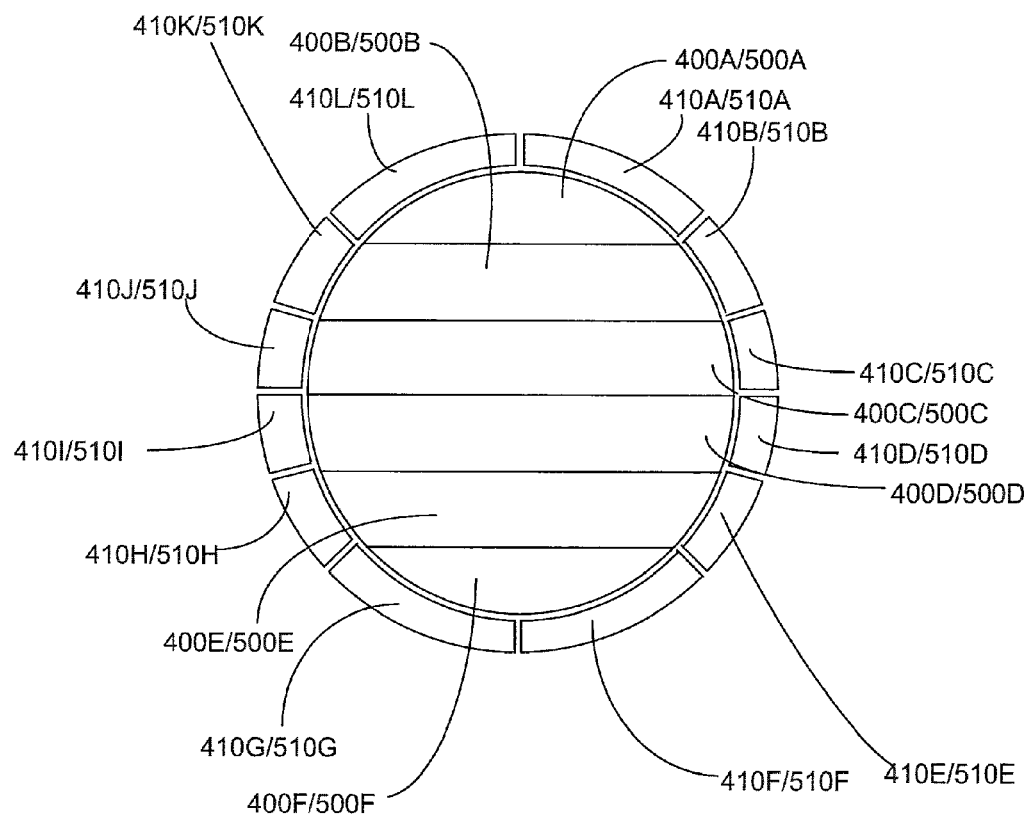
FIG. 10 illustrates, in plan, heaters and/or temperature sensors in a central portion of a substrate supporting area and edge heaters adjacent different portions of an edge of the substrate supporting area.

FIG. 10 shows, in plan, one embodiment of an arrangement of a plurality of heaters 400 and/or temperature sensors 500. A plurality of heaters 400 A-F and/or temperature sensors 500 A-F are elongate. They are substantially parallel in elongate direction and extend across the substrate supporting area from one edge to an opposite edge. The benefit of this arrangement will be explained with reference to FIG. 11 below.

Surrounding the central portion of the substrate supporting area where the heaters 400 A-F and/or temperature sensors 500 A-F are located, are a plurality of edge heaters 410 A-L and/or temperature sensors 510 A-L. The edge heaters 410 A-L and/or temperature sensors 510 A-L are of different sizes around the edge of the substrate supporting area. The sizes are to match the dimension in the direction of the heaters 400 A-F and/or temperature sensors 500 A-F in the central portion.

The plurality of edge heaters are designed to do the job of the heating element 250 in FIG. 8. That is, they are designed to compensate for the high evaporational loads around the edge of the substrate W as described in connection with FIG. 7. The edge heaters 410 A-L and/or temperature sensors 510 A-L may be positioned on a surface of the burl plate 600 or on a different surface.

An embodiment of the present invention may be used on its own or in combination with an edge heater 250 as illustrated in FIG. 8 and/or a passage 230 adjacent the substrate supporting area for the passage of a thermal conditioning fluid therethrough such as illustrated in FIG. 8. Additionally, the heaters and/or temperature sensors of an embodiment of the invention may be employed in combination with a substrate table WT conditioned by a two-phase fluid. In such an embodiment a chamber is provided in the body of the substrate table WT which is filled with a fluid in both gaseous and liquid phases. Such a substrate table conditioning system is described in U.S. patent application Ser. Nos. 61/246,276, filed on 28 Sep. 2009 and U.S. Ser. No. 61/246,268, filed on 28 Sep. 2009, both hereby incorporated in their entirety by reference.

An advantage of an embodiment of the present invention is present both for heaters and for temperature sensors. The substrate table WT may comprise one or the other or both. Both heaters and temperature sensors take advantage of the fast thermal response of the thin film heaters and/or temperature sensors.

Figure 11:
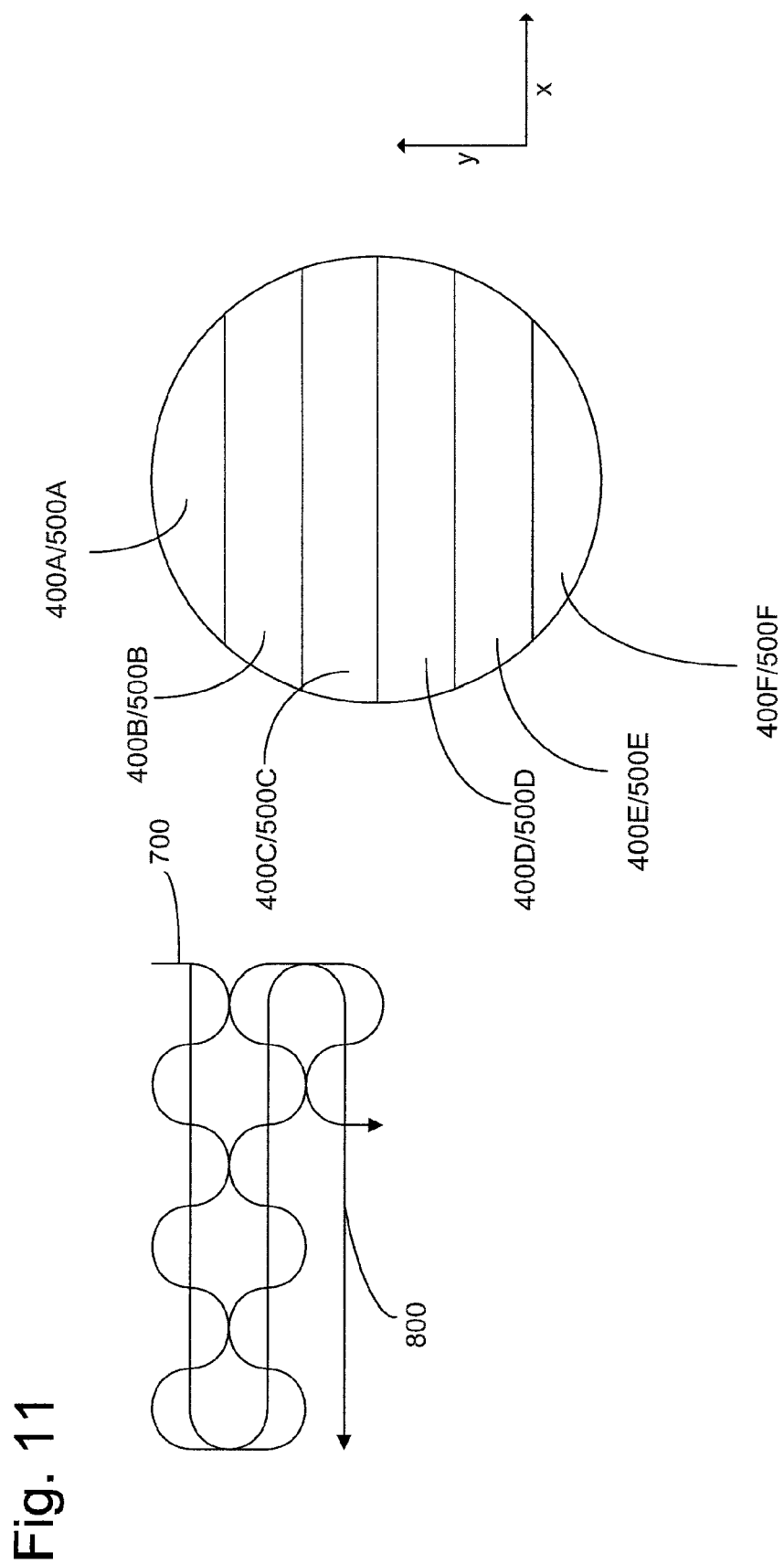
FIG. 11 illustrates, in plan, an embodiment without edge heaters and also illustrates a meander path which the substrate support may take under the projection system.

The arrangement of heaters and/or sensors illustrated in FIGS. 10 and 11, in particular, are also relevant to other types of heaters and/or temperature sensors which are not necessarily thin films.

In one embodiment the heaters and/or temperature sensors are not on a surface but are enclosed within a component of the substrate table WT. The heaters and/or temperature sensors may be embedded in a top plate (e.g. a quartz plate) of the substrate table WT. The top plate may comprise two sections, with the heaters and/or sensors embedded therebetween.

FIG. 11 shows an embodiment, in plan. In FIG. 11 the edge heaters 410 A-L and/or temperature sensors 510 A-L are not present. It may not be necessary to include edge heaters, depending on the design of the substrate table WT at the edge of the substrate W. Such an embodiment is illustrated in FIG. 11.

Also illustrated in FIG. 11 is a meander path 700 which the substrate table WT takes under the projection system PS. The general overall motion of the meander path is illustrated by line 800.

As can be seen by comparing line 700 and line 800, whilst following the general path 800 moving backwards and forwards in the X direction takes place. Scanning in the Y direction is very fast. As a result, it can be seen that the substrate table WT moves fairly slowly from the top of the substrate (as illustrated) down to the bottom of the substrate along the Y direction. For this reason the heaters and/or temperature sensors 400 A-F, 500 A-F (and edge heaters and/or temperature sensors) are elongate in the X direction. The heaters and/or temperature sensors are elongate in a first direction. The first direction is orientated such that the length of time a given heater and/or temperature sensor 400, 500 stays under the projection system during imaging of the substrate W is greater than if the heater and/or sensor were orientated with its elongate direction perpendicular to the first direction (in which case it would be passed over several separate times during imaging of the whole substrate). In particular, the time that a given heater and/or temperature sensor is under the projection system during imaging of the substrate is substantially maximized. In one embodiment this is done by ensuring that the elongate direction of the heaters and/or temperature sensors is parallel with the scanning direction. However, other geometries may be more suitable for different scanning patterns. Thus during imaging the substrate steps in the X direction along the top heater/temperature sensor 400A/500A while scanning in the Y direction. This results in the area at the top of the substrate receiving a heat load and this is sensed and compensated for by the top heater and temperature sensor combination 400A/500A. The substrate then moves in the Y direction to move the second heater/temperature sensor combination 400B/500B under the projection system and scans in the Y direction. The heat load is concentrated at that Y position and the sensor/heater combination 400B/500B compensates accordingly. While stepping in the X direction any heat load is concentrated in that X direction. In positions along the Y axis away from the projection system, little heat load will be present.

An advantage of having elongate heaters and/or temperature sensors is that then the number of heaters and/or temperature sensors can be reduced than would be the case if the heaters and/or temperature sensors were made with an aspect ratio of substantially one (i.e. the same dimension in both the X and Y directions). The reduced number eases control and reduces the complexity of the system and in particular reduces the difficulty of connecting the heaters and/or temperature sensors. As will be illustrated with reference to FIG. 12, with the embodiment of FIGS. 10 and 11, the heaters and/or temperature sensors may be connected to a controller at the edge of the burl plate 600 relatively easily.

The plurality of heaters and/or temperature sensors are elongate in substantially parallel directions.

Figure 12:
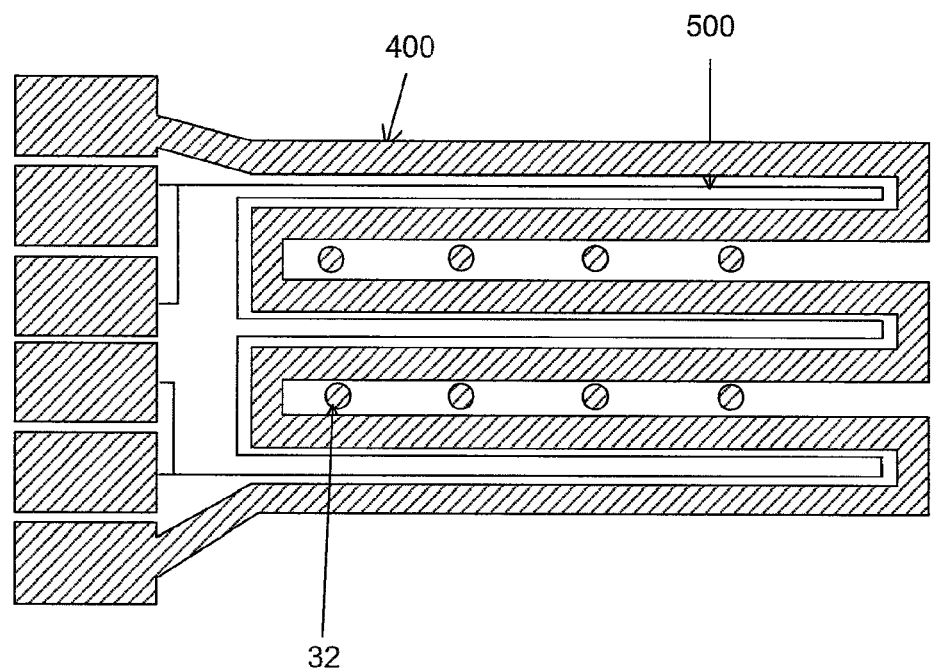
FIG. 12 is a schematic drawing illustrating the construction of a heater and temperature sensor, in plan.

FIG. 12 illustrates, in plan, a single integrated heater and corresponding temperature sensor. Similar principles may be used for only a heater or for only a temperature sensor. The heater and temperature sensor are integrated in terms of heating and sensing the temperature of the same area.

As illustrated in FIG. 12, the heater and temperature sensor are formed as lines or wires. The lines or wires cover the area of the overall heater and/or temperature sensor. This is done by making the lines follow a tortuous path. In the embodiment illustrated, the lines follow a tortuous path between burls 32 but that is not necessarily the case. As illustrated in FIG. 12, the line of the heater follows a substantially parallel path to the line of the temperature sensor. The two lines do not cross and weave their way in and out of the burls to cover as much area of the overall heater as is possible. The lines terminate at electrodes to allow connection to a control system.

A controller is provided. The controller attempts to maintain the measured temperature at a given set point. The faster the response the better the performance which can be expected. The lower the thermal time constants, the smaller the net maximum temperature change which will occur on the application of a heat load. The controller may control the heaters based on feedback from sensors. Feed forward control is possible based on the position of the liquid handling system 12 relative to the substrate table WT.

Figure 26:
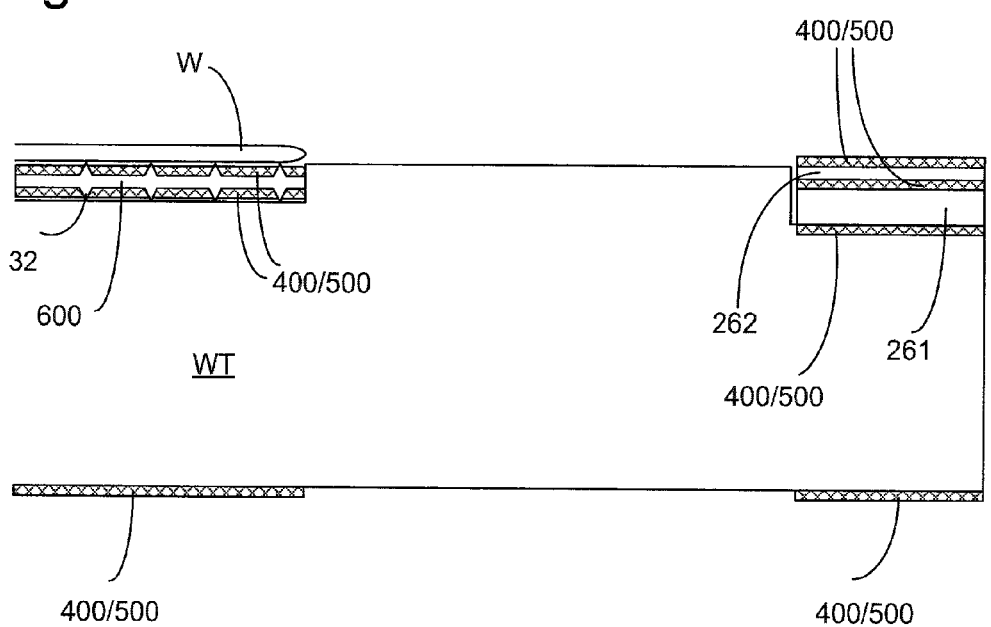
FIG. 26 is a schematic drawing, in cross-section, illustrating where heaters and/or temperature sensors may be placed.

As depicted in FIG. 26, an embodiment of the invention is to apply one or more thin film platinum sensors and/or heaters on the top or bottom of the substrate table WT. In an embodiment the burl plate 600 is positioned between the substrate table WT and the substrate W. In an embodiment, the thin film heaters 400 and/or temperature sensors 500 are applied to the top of the burl plate 600. In an embodiment, the thin film heaters 400 and/or temperature sensors 500 are applied to the bottom surface of the burl plate 600. In an embodiment, the thin film heaters 400 and/or temperature sensors 500 are applied to the bottom surface of the substrate table WT.

The thin film heaters 400 and/or temperature sensors 500 may be applied to the upper surface or lower surface of a sensor that is positioned on the substrate table WT. FIG. 26 depicts a sensor 261 on the surface of the substrate table WT. The sensor 261 may be a dose sensor, an aberration sensor, an illumination sensor, a uniformity sensor or an aerial image sensor, for example. The sensor 261 may comprise an encoder grid plate to control the position of the substrate table WT. The sensor 261 may comprise a protective plate 262 at its upper surface. The protective plate 262 may be formed of a glass. The one or more thin film heaters 400 and/or temperature sensors 500 may be applied to the upper surface and/or lower surface of the protective plate 262.

Figure 29:
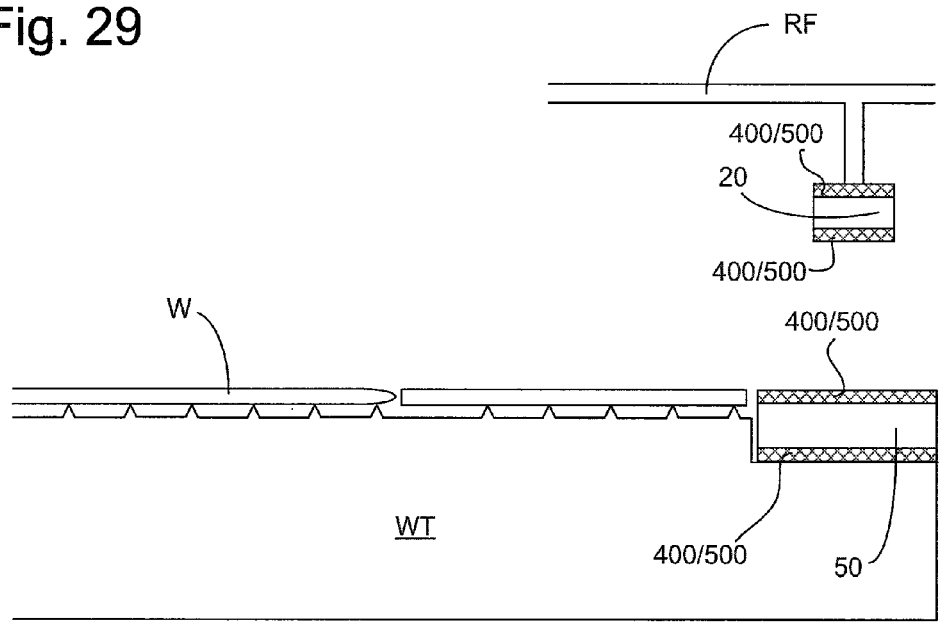
FIG. 29 is a schematic drawing, in cross-section, illustrating where heaters and/or temperature sensors may be placed.

FIG. 29 depicts a lithographic apparatus comprising a substrate table WT, a reference frame RF, a grating 50 and a sensor 20. The grating 50 is attached to the substrate table WT or the reference frame RF. The sensor 20 is attached to the other of the substrate table WT and the reference frame RF. FIG. 29 depicts the case in which the grating 50 is attached to the substrate table WT and the sensor 20 is attached to the reference frame RF.

The sensor 20 is to detect radiation diffracted and/or reflected by the grating 50, thereby to measure the relative position between the substrate table WT and the reference frame RF. This is a type of positional measurement device used in a lithographic apparatus in which the grating 50 and sensor 20 are mounted on different objects which are moveable relative to one another and whose relative position is desired to be measured.

The thin film heaters 400 and/or temperature sensors 500 may be applied to the upper surface or lower surface of the grating 50 and/or the sensor 20. The grating 50 may be formed on a plate of optically transparent material such as quartz or a glass-ceramic, for example. This plate may be termed an encoder grid plate. In this description, the term grating 50 is understood to mean the encoder grid plate with a grating pattern formed thereon.

The thin film heaters 400 and/or temperature sensors 500 may be applied directly to the surface of the encoder grid plate. In an embodiment, the thin film heaters 400 and/or temperature sensors 500 are applied directly to the surface of the encoder grid plate that is exposed to the immersion liquid. This is because the material of the plate, such as quartz or glass-ceramic, may have a relatively low thermal conductivity. Hence, local temperature changes due to thermal loads can be corrected more quickly by positioning the thin film heaters 400 and/or temperature sensors 500 on the exposed surface of the grating 50 than by positioning the thin film heaters 400 and/or temperature sensors 500 on the rear side of the grating 50.

This controls the temperature of the grating 50 and/or sensor 20. Control of the temperature of the grating 50 and/or sensor 20 helps to reduce positional errors that would otherwise lead to overlay errors. The positional errors are caused by thermal deformation of a surface of the grating 50 and/or sensor 20. Such thermal deformation is caused by a thermal load on the surface. A thermal load may be applied to the surface if a liquid not the same temperature as the surface comes into contact with the surface. For example, the liquid may evaporate, or in any case thermally equilibrate with the surface. This may be a problem for the grating 50 as depicted in FIG. 29 because the grating 50 is located on the upper surface of the substrate table WT and over which the fluid confinement structure 12 is located. The fluid confinement structure 12 may become located over part or all of the grating 50 during normal operation of the lithographic apparatus Immersion liquid may escape from the fluid confinement structure 12 and splash onto or remain on the grating 50 as a droplet. Of course, the same problem can occur if the sensor 20 is positioned on the top surface of the substrate table WT and the grating 50 is positioned on the reference frame RF.

The grating 50 may comprise a grid plate and a grating surface formed on an under side of the grid plate. The purpose of this is to prevent the grating surface itself from coming into contact with the immersion liquid.

Figure 30:
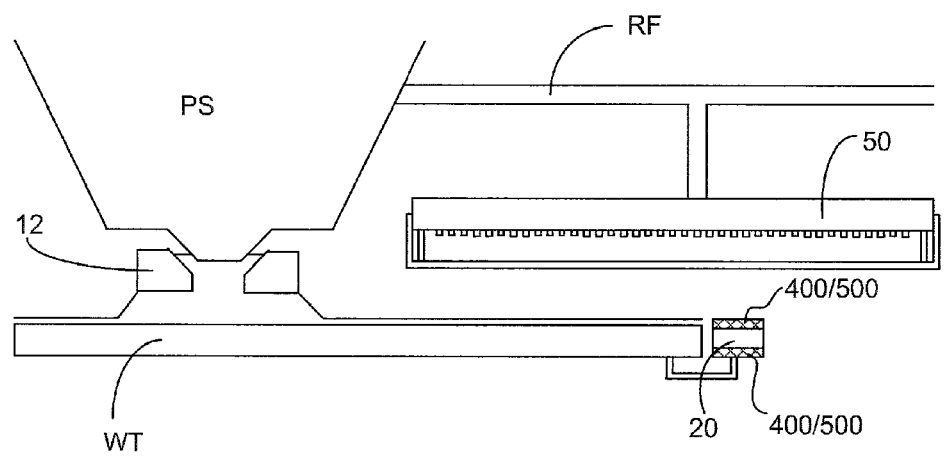
FIG. 30 is a schematic drawing, in cross-section, illustrating where heaters and/or temperature sensors may be placed.

Although in the above, an embodiment of the invention has been described with respect to the grating 50, the same advantages and mechanisms are applicable to the temperature control of the sensor 20. For example, FIG. 30 depicts an embodiment in which the grating 50 is attached to the reference frame RF and the sensor 20 is attached to the substrate table WT. The thin film heaters 400 and/or temperature sensors 500 may be applied to the upper surface or lower surface of the sensor 20.

Figure 31:
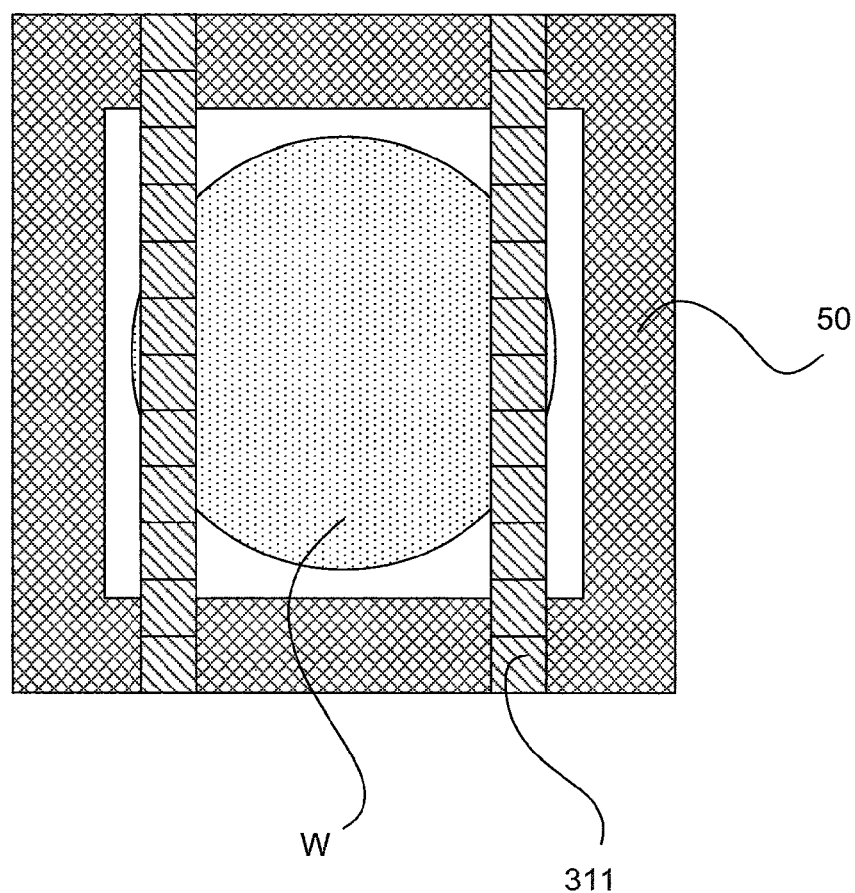
FIG. 31 is a schematic drawing, in plan, illustrating where temperature sensors may be placed.

FIG. 31 depicts an embodiment in which additionally or alternatively to the thin film temperature sensors 500, the lithographic apparatus may comprise a non-contact temperature sensor 311. The non-contact temperature sensor 311 may comprise an infrared temperature sensor. In an embodiment, the non-contact temperature sensor 311 comprises an array of infrared sensors. The sensors may face towards the grating 50. For example, in an embodiment in which the grating 50 is positioned on an upper surface of the substrate table WT, the non-contact temperature sensor 311 may face downward to the grating 50.

The non-contact temperature sensor 311 may be attached to the reference frame RF as depicted in FIGS. 29 and 30, or the contact temperature sensor 311 may be attached to a measurement frame that is different from the reference frame RF.

The non-contact temperature sensor 311 may comprise a line of infrared sensors located above the substrate table WT. The non-contact temperature sensor 311 measures the temperature of the grating 50 as the substrate table passes under the non-contact temperature sensor 311. This measurement may be performed during the alignment/focus measurement phase, the exposure phase or the substrate/substrate table swap phase, for example.

In an embodiment, the thin film heaters 400 and/or temperature sensors 500 are applied to a surface of a measurement table.

Whether the thin film heaters 400 and/or temperature sensors 500 are applied to a surface of the burl plate 600, the substrate table WT or a sensor 261, the heaters 400 and/or temperature sensors 500 may be applied by a number of different methods.

The heaters 400 and/or temperature sensors 500 may be glued on to the appropriate surface. The layer of glue between the heaters 400 and/or temperature sensors 500 should be as thin as possible in order to reduce the contact resistance. The glue may comprise a polymer. The glue may further comprise at least one metal and/or carbon fiber. The purpose of this is to make the glue electrically conductive and/or more thermally conductive. The glue may be a pressure sensitive adhesive. This means that when pressure is applied to the glue, the layer of glue becomes thinner. The glue may also be termed an adhesive.

An alternative way to apply the thin film heaters 400 and/or temperature sensors 500 to a surface is to form the network of heaters 400 and/or sensors 50 as a coating on the surface. The coating may be formed by using either a positive photoresist or a negative photoresist.

In the case of using a positive photoresist, a coating of positive photoresist is applied (e.g. sprayed) onto the surface. An isolation layer, which may be made of $SiO_2$, may be applied prior to the positive photoresist coating such that the isolation layer is between the positive photoresist coating and a surface.

Once the positive photoresist coating has been applied to the surface, the coating is exposed at positions where the network of heaters 400 and/or temperature sensors 500 is not to be applied, thereby to harden the positive photoresist at those positions. The remaining sections of photoresist are removed, thereby opening a gap where the thin film is to be applied. The thin film, which may be made of platinum or an alloy of titanium and platinum, for example, is applied to the surface and the photoresist. The photoresist that remains on the surface is stripped via, for example, an ultrasonic stripping technique to remove the unwanted sections of thin film. The result is a network of thin film in the desired places.

A two-step photoresist method may be used in which two layers of photoresist are applied. The top layer of photoresist is exposed so as to be hardened in positions where the thin film is not to be applied. When the photoresist is developed by removing the section of photoresist that is not hardened, the upper layer of photoresist overhangs the lower layer of photoresist such that the top layer of photoresist does not touch the surface of the substrate W. This reduces defects in the photoresist.

If a negative photoresist is used, a layer of negative photoresist is coated onto the surface. This may be done by spraying. An isolation layer may be applied before the negative photoresist layer. The photoresist is exposed in regions where the thin film is to be applied. These sections of photoresist are then removed. The thin film material is disposed on the surface. The remaining sections of photoresist are stripped, thereby leaving the desired pattern of thin film material.

A further way to apply the thin film to the surface is to pre-apply adhesive to one side of the thin film material. The thin film with adhesive pre-applied to one surface may be termed a sticker. The sticker may then be applied to the surface. In the case of a sticker, the thin film material may be housed within an insulating material, such as a polyimide. In particular Kapton® may be used as the insulating material for the sticker.

It is desirable for the thin film to be directly bonded to the surface in order to reduce the thermal resistance between the thin film and the surface. However, an adhesive, which is desirably thermally conductive, may be used to apply the thin film to the surface.

The material of the thin film heaters 400 and/or temperature sensors 500 may be platinum, or a platinum alloy. The thin film material may comprise at least one of copper, aluminum, silver, gold and a semiconductor material, which may comprise a metal oxide and/or silicon. In the case of a sticker (i.e. thin film pre-applied with an adhesive, the thin film within an insulating housing), copper may in particular be used. The material for the thin film should be stable over time.

Figure 28:
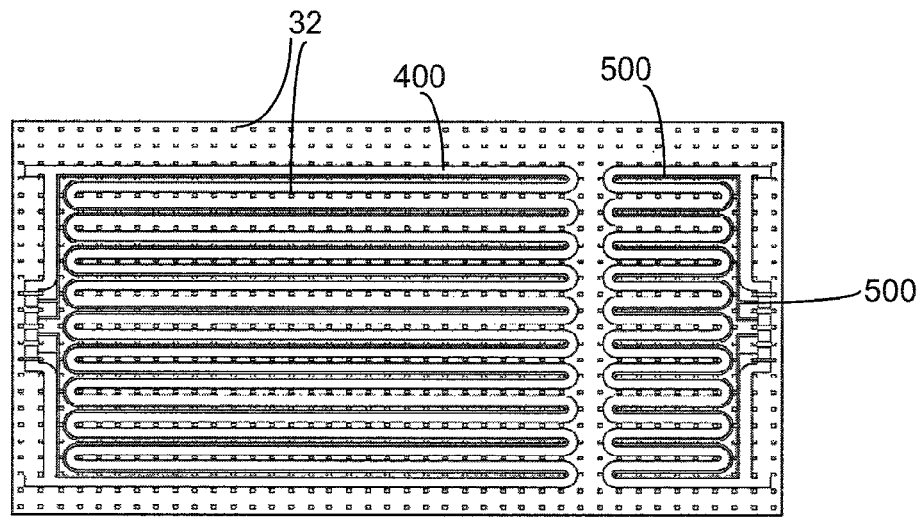
FIG. 28 is a schematic drawing, in plan, illustrating a mask that may be used to deposit a thin film heater and/or temperature sensor.

If the thin film is applied to the surface as a coating, a mask may be used to provide that the thin film material is applied to the desired sections of the surface. In particular, a mask may be used when the one or more thin film heaters 400 and/or temperature sensors 500 are applied to a surface of the burl plate 600. FIG. 28 depicts a mask that may be used. FIG. 28 depicts thick lines indicating positions for the thin film heaters 400 and thin lines indicating positions for the temperature sensors 500. The mask is used to avoid the thin film material from being deposited undesirably on the burls 32.

Figure 27:
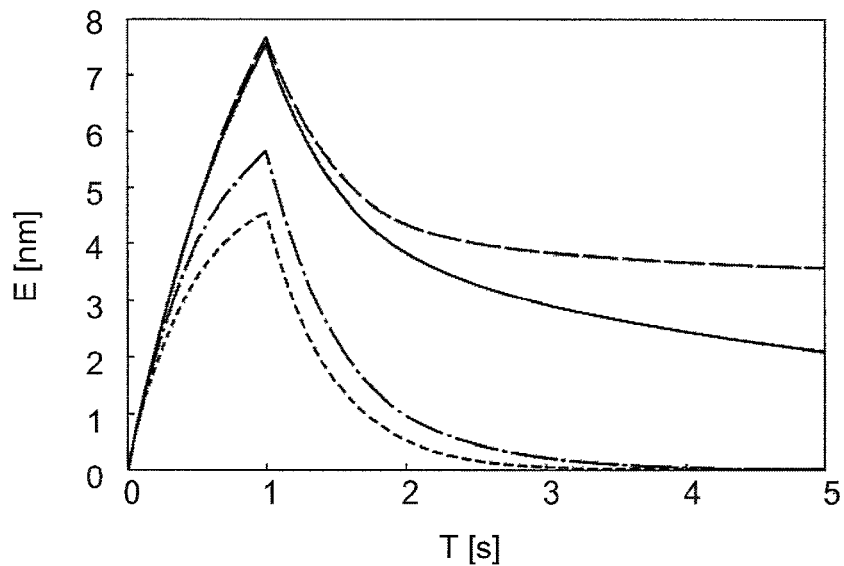
FIG. 27 is a graph illustrating the effectiveness of a thin film heater and/or temperature sensor.

FIG. 27 is a graph that illustrates the effectiveness of using one or more thin film heaters 400 and/or sensors 500. The graph includes four lines showing how the fingerprint size varies as a function of time depending on the type of conditioning used to control the temperature of the system. The line formed of long, broken sections represents the situation where no temperature conditioning is applied. The solid line represents the situation where a heat transfer fluid channel 200 (as depicted in FIG. 8) is used to perform temperature conditioning. The dot-chain line represents thin film conditioning, using a configuration as depicted in FIG. 9. The line formed from short, broken sections represents ideal conditioning.

It is clear that the thin film conditioning has a result that is far closer to the theoretical ideal conditioning than conditioning by a heat transfer fluid flowing in a heat transfer fluid channel 200 in the substrate table WT under the substrate supporting area.

An advantage of using thin film technology is that the sensing and heating lines are well connected to the surface, resulting in a very low thermal contact resistance. Another advantage is that both sensors and heaters are made from the same material and that the complete layout of multiple sensors and heaters can be attached in one process step.

Because the thermal resistance is very low, thermal simulations of a substrate table with thin film sensors and heaters show that substrate table temperatures can stay within mK's making it an almost ideal table conditioning concept. To cope for heating loads in one embodiment a substrate table has heaters and sensors on the top as described above in relation to FIGS. 10 and 11 and water conditioning in the middle. In one embodiment the substrate table WT does not have water conditioning. This is possible for immersion machines were cooling loads are dominant. In order to minimise the number of sensors and heaters to be controlled, the following layout of FIG. 10 is suitable, with a 18 or 22 areas which each consist of 1 sensor-heater combination.

Of course other layouts with more or less areas may be used. Because scanning in X-direction takes typically less than 2 seconds for one row, one heater-sensor-combination over the full width of the substrate W is sufficient. In the Y-direction more combinations may be required to cope with longer time scales, typically 10-20 seconds. The meander takes a longer time to move in Y-direction. The sensor-heater combination is able to react within 0.5 second, so field size in Y shall be limited. The multiple edge heater-sensor-combinations (12 or 16 areas, respectively) are provided to cope with the extra gap 5 evaporation loads. If these gap 5 evaporational loads are much reduced, then the edge combinations can be left out. Then the layout becomes as in FIG. 11.

The heater and sensor within one area shall be evenly distributed over the total surface of its area for instance as illustrated in FIG. 12

Overlay performance increases because thermal cooling loads are measured and corrected locally and within short time scales;

Doing away with water conditioning is advantageous because no water hoses and no hydrodynamic pressure pulses are then present and this allows for thinner substrate tables resulting in less scan-up scan-down problems.

A further advantage of using one or more thin film heaters 400 and/or temperature sensors 400 is that they have a lower mass than other types of heaters or temperature sensors. This results in a substrate table WT that has a lower mass than otherwise.

An embodiment of the invention is applicable to both 300 and 450 mm diameter substrates W. For a 450 mm diameter substrate, the number of sensors/heaters 400/500 will increase. The center sensors/heaters 400/500 will be 450 mm in X and still 50 mm in Y, resulting in 9 sensors/heaters 400/500 in Y, while for a 300 mm diameter substrate, there are 6 sensors/heaters 400/400 in Y. The edge sensors/heaters 410/510 will get a similar pattern to the 300 mm diameter substrate resulting in 21 or 25 sensors/heaters 410/510 (i.e., the 300 mm diameter substrate may have 18 or 22 sensors/heaters).

The number of heaters and/or temperature sensors in the center portion of the substrate supporting area may in one embodiment be only one (for example covering a large proportion of the area) for global temperature correction. In another embodiment a 'check-board' with many sensors/heaters 400/500 (for instance 1 sensor/heater 400/500 per die size 26 mm×32 mm) of heaters and/or temperature sensors may be present, for local correction.

The temperature sensor and heater lines within one die are not necessarily aligned with the die orientation. The line length, line width, burl pattern and wire connection points will determine the layout.

The edge heaters and/or sensors may be within or outside of the burls of the burl plate 600 or on the side edge or on the substrate table ring.

The following are aspects of the invention:

a) optimized bands of integrated heater and/or temperature sensor: variations are possible to the optimal arrangement of heater and/or temperature sensor if the standard immersion hood path were to vary;

b) having a heater across the table surface;

c) having a sensor across the table surface;

d) having a sensor and heater integrated with each other, over the surface of the table;

e) having the sensor and/or heater integrated with the burls;

f) having the sensor and/or heater as a thin film;

g) using an integrated sensor/heater with an existing wafer edge heater, two phase table control, and/or internal fluid conditioning system;

i) that there are systems on one side or both of the substrate support; and j) an optimal arrangement for integrating the sensors and the heaters.

Figure 13:
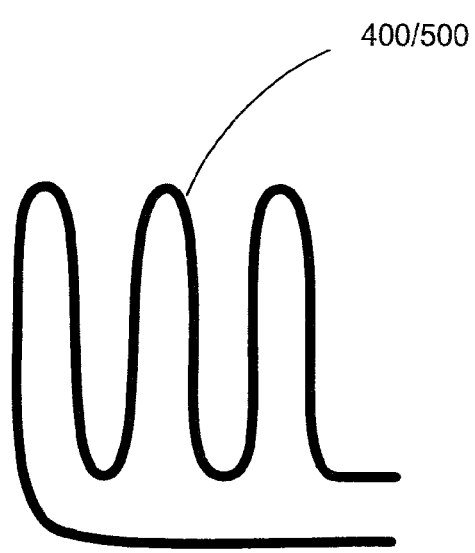
FIG. 13 is a schematic drawing illustrating the construction of a heater and/or temperature sensor, in plan.

The heater 400 and/or temperature sensor 500 may be of any shape, in plan. FIG. 13 shows one example in which a heater and/or sensor 400, 500 comprises a line forming a meandering path. A heater 400 and a sensor 500 may be associated with one another (as for example, in FIG. 12). The shape, in plan, of the heater 400 and sensor 500 may or may not be substantially the same.

Figure 14:
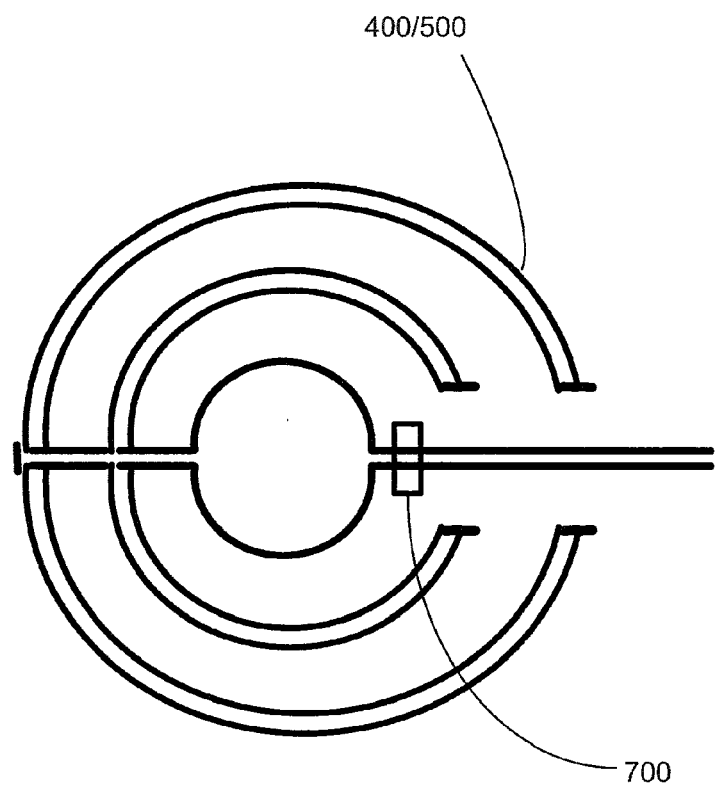
FIG. 14 is a schematic drawing illustrating the construction of a heater and/or temperature sensor, in plan.

FIG. 14 shows a further shape, in plan, of a sensor 500 and/or heater 400. In the case of FIG. 14 the overall shape of the sensor 500 and/or heater 400, in plan, is that of concentric circles which are joined together to form a circuit.

The heater/sensor 400/500 embodiments of FIGS. 13 and 14 can be formed of one line to form a heater 400 and an associated sensor 500 in the form of a self-regulating thermal system, as described below, particularly with reference to FIG. 19 or as a micro-electro-mechanical system (MEMS) described below with reference to FIGS. 16 and 17.

Figure 15:
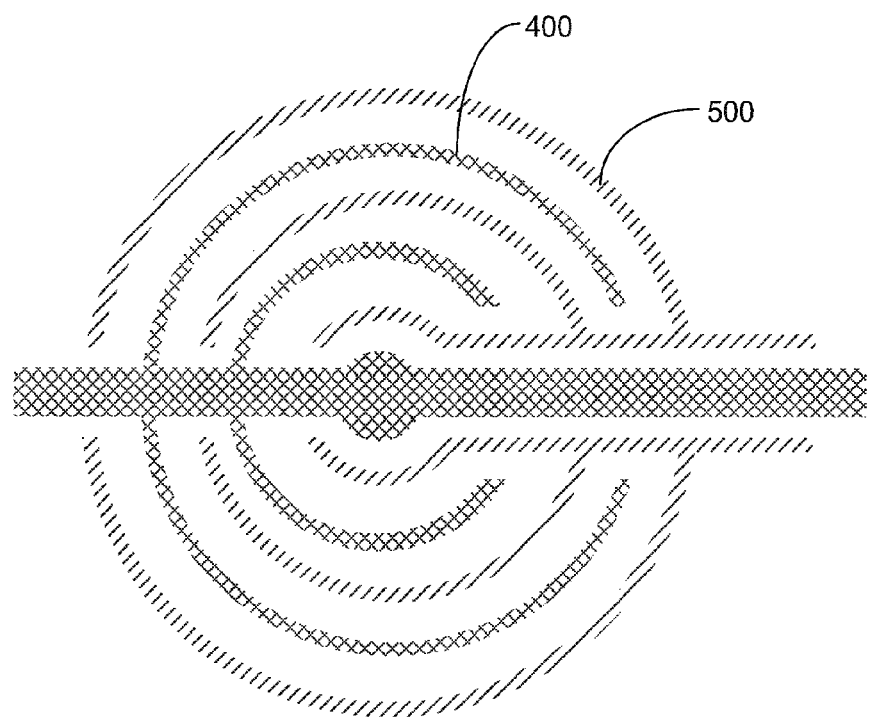
FIG. 15 is a schematic drawing illustrating the construction of a heater and a temperature sensor, in plan.

The embodiment of FIG. 15 is an embodiment in which the heater 400 and sensor 500 are separate lines and are both formed as concentric interwoven circles.

The self-regulating system is a device that activates or deactivates a heater due to local change in temperature. This heater provides the desired thermal compensation at the right place and at the right time without any external input apart from the local change in temperature. In general, there are two ways to make a self-regulating device: (i) a heater with a MEMS switch, (ii) a heater made of a self-regulating material that has a high non-linear relationship between its electromagnetic (EM) properties and temperature.

These devices are only a few micrometers thick, and their manufacturing can be done by advanced direct writing or thin film technologies such as metal and dielectric deposition, photolithography, wet and dry etching, galvanic and electro-less plating, diffusion and ion implantation among others. Due to the reduction in size of self-regulating devices, they can be placed easily on any configuration, number (in the order of thousands), geometry or on any surface.

The system can be trimmed using laser adjustment by removing material, reshaping the actuators, or changing its material crystallinity (if that is possible), among other methods. In the case of complex surfaces, the self-regulating system can be assembled first on a thin flat film and then transferred onto the final surface.

The heater 400 and/or temperature sensor 500 may form a self-regulating thermal system. That is, no control signals need to be provided to the heater 400 and no signals need to be received from the temperature sensor 500 by a remote controller. Instead, a voltage is applied to the heater 400 and/or temperature sensor 500 which then compensates for local temperature variation without the need for a separate controller.

One form of self-regulating thermal system is a MEMS based self-regulating heater described below with reference to FIGS. 16 and 17. A further form is an EM-temperature based self-regulating heater described with reference to FIGS. 18, 19 and 20.

A MEMS heater 400 is a heater activated and/or deactivated by a MEMS sensor 500. In one embodiment the sensor 500 is a switch. The switch can be made of a positive coefficient of thermal expansion material, or a negative coefficient of thermal expansion material, or a bi-metallic material. FIG. 16 shows a MEMS based self-regulating heater 400 and sensor 500, in cross-section. FIG. 17 shows a detail of the temperature sensor 500 of FIG. 16.

Figure 16:
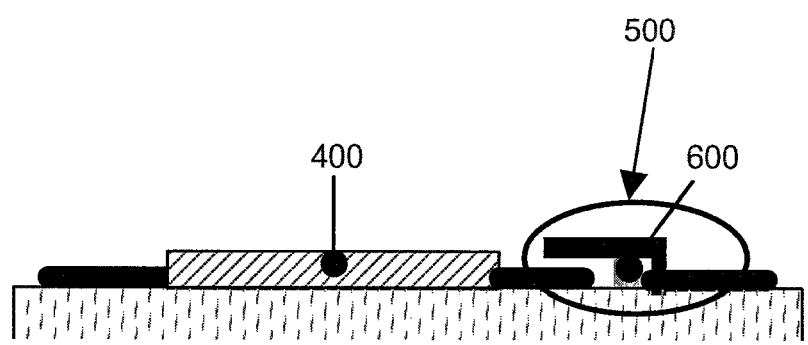
FIG. 16 is a schematic drawing illustrating the construction of a micro-electro-mechanical system (MEMS) heater/sensor, in cross-section.
Figure 17:
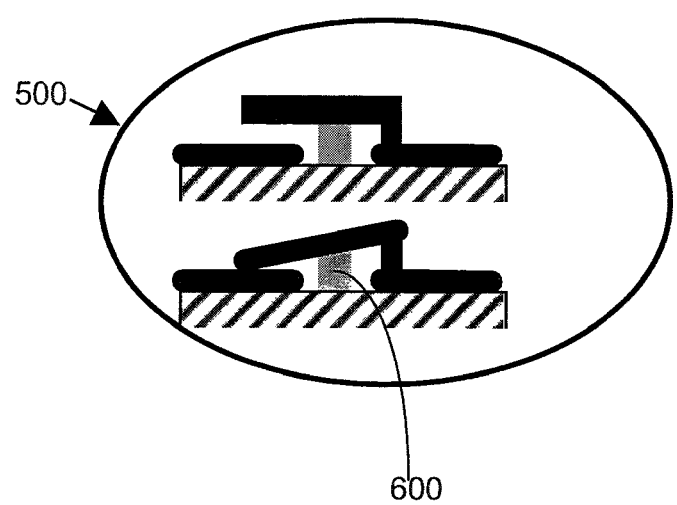
FIG. 17 is a detail of FIG. 16 showing the operation of the sensor.

In FIG. 16 a heater 400 is connected in series with a temperature sensor 500. The temperature sensor 500 is in the form of a self-regulating switch. A material 600 with a positive or negative coefficient of thermal expansion or a bi-metallic material operates the switch. Useful materials for construction of the sensor include silicon, polysilicon or a silicon compound such as silicon nitride or a metal such as gold. Thermal expansion and/or contraction of the material 600 results in the switch being open above or below a certain temperature (top figure of FIG. 17) and the switch is conversely closed below or above the certain temperature. Current runs through the heater 400 when the switch is closed. In one embodiment when the heater 400 is connected to a power supply, and a change in temperature occurs, for example during cooling, the MEMS switch closes the circuit. Then an electrical current flows through the heater 400 and warms the surface on which the heater 400 is formed. As the temperature increases, the material 600 of the switch starts to deform (expansion, contraction or bending depending on the selective material) until the switch is opened stopping current from passing through the heater 400 and thereby stopping heating.

The geometry of the MEMS structure can vary depending on the functionality (for example to include an overheat protection and improve the manufacturability of the switch). Desirably the MEMS switch is adjacent or inside the heater 400 layout in order to react quickly to the temperature change produced by the heater 400. The embodiment of FIG. 14 shows a position 700 which would be suitable for positioning of the MEMS sensor/switch when the embodiment of FIG. 14 is a MEMS based self-regulating heater.

In one embodiment the self-regulating heater may be an EM-temperature based self-regulating heater. This embodiment has an advantage (also present in the MEMS embodiment) that only a single line needs to be placed on the surface.

Figure 18:
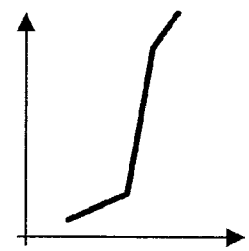
FIG. 18 is a graph illustrating the variation of resistance on the Y axis versus temperature on the X axis for an EM-temperature based self-regulating heater.

A heater 400 made of a self-regulating material (for example a semi-conductive polymer) may also act as a sensor 500 and switch as it is deactivated or activated as its EM property changes in response to the surrounding temperature. FIG. 18 shows an example in which the resistance (Y axis) of a self-regulating heater varies as a function of temperature (along the X axis). Therefore if an electrical EM-temperature based self-regulating heater is connected to a power supply (for example of a fixed voltage), then under a change in temperature, for example during cooling, the electrical resistance of the self-regulating material decreases considerably. This process allows a flow of electrical current through the heater thereby warming the surface. The heat increases the temperature of the heater and its surroundings thereby increasing the electrical resistance until the current ceases completely at a given temperature. This situation stops the heating process.

Figure 19:
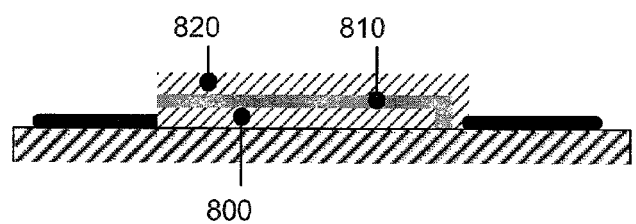
FIG. 19 is a schematic drawing illustrating the construction of an EM-temperature based self-regulating heater, in cross-section.

The construction of an EM-temperature based self-regulating heater can be made by placing on a surface a thermal and electrically conductive layer 800, then a self-regulating material film 810 and an electrically conductive but similarly isolating layer 820 on top, as illustrated in FIG. 19.

Figure 20:
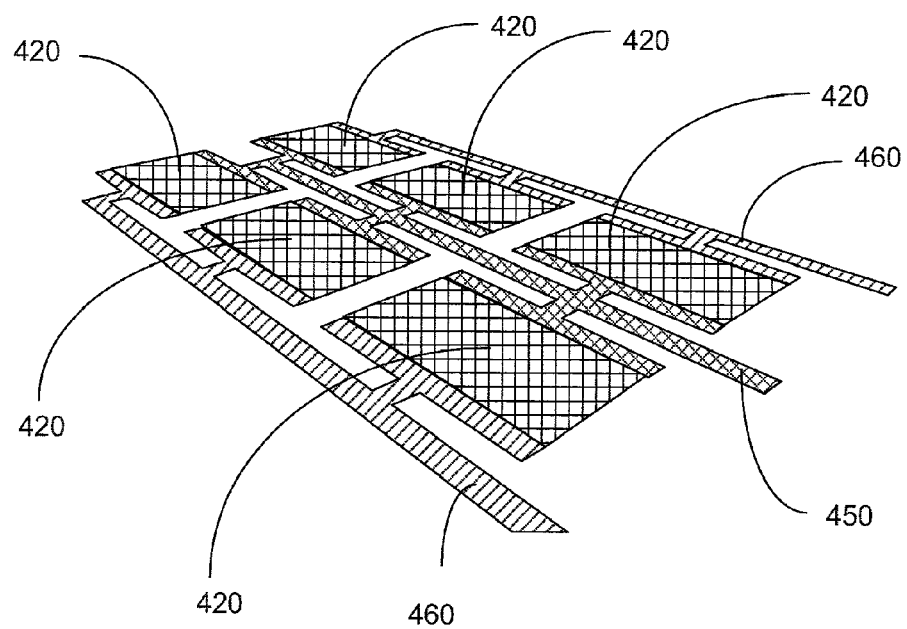
FIG. 20 is a perspective view of an arrangement of EM-temperature based self-regulating heaters.

An EM-temperature based self-regulating heater can have any shape, in plan. Indeed the heater need not be in the form of a line and could be in the form of blocks as illustrated, in perspective view, in FIG. 20. In FIG. 20 heater/temperature sensors which are comprised of an EM-temperature based self-regulating heater 420 are illustrated. The central electrical connection 450 is common to all EM-temperature self-regulating heaters 420 and two electrodes 460 on either side of the EM-temperature based self-regulating heaters 420 can be used to complete the electrical circuit.

A non uniform temperature on a substrate W, due to liquid evaporation, can be corrected by a self-regulating substrate table WT. The self-heating devices can be placed on the upper or lower burl plate 600 surface. Under the presence of cold spots, for example droplets, electrical heaters 400 closer to those zones will be self-activated to compensate thermally the substrate by heat conduction through the burls. Only two wires are required to power the substrate table WT. This system can reduce considerably the weight of the substrate table WT while increasing its reliability due to multiple self-regulating heaters 400 placed on it.

Figure 21:
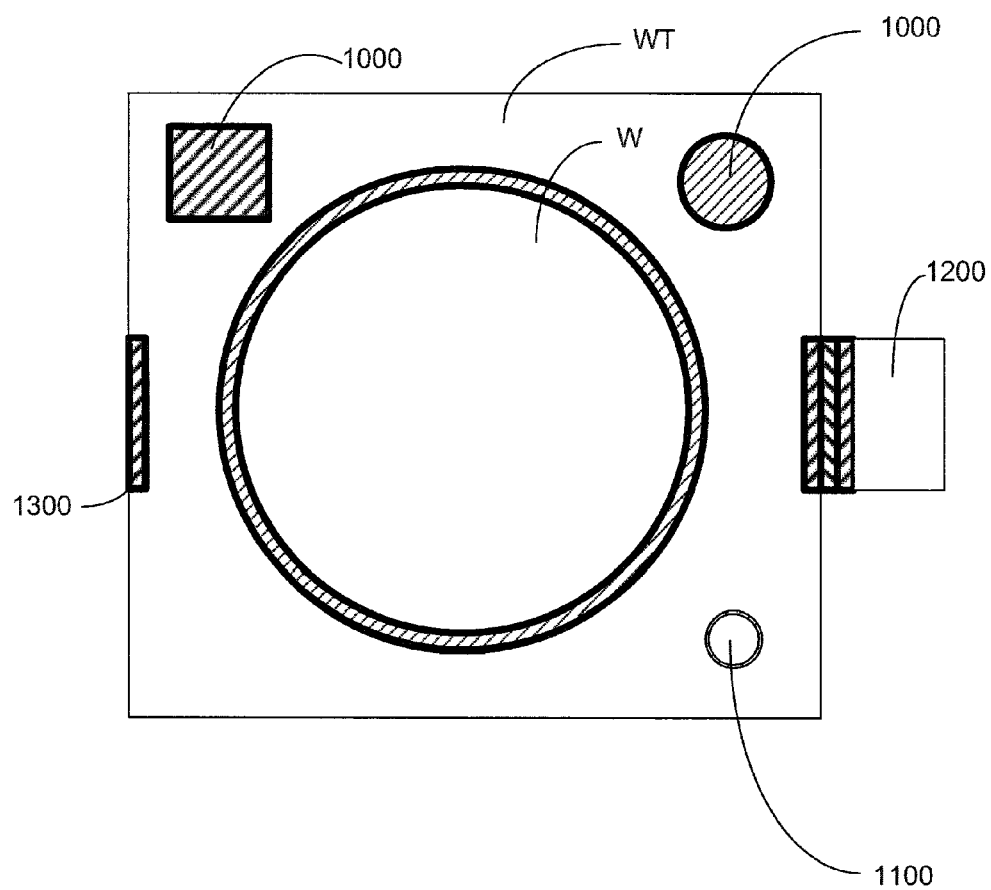
FIG. 21 is a schematic drawing, in plan, illustrating where heaters and/or temperature sensors may be placed on a substrate table.
Figure 22:
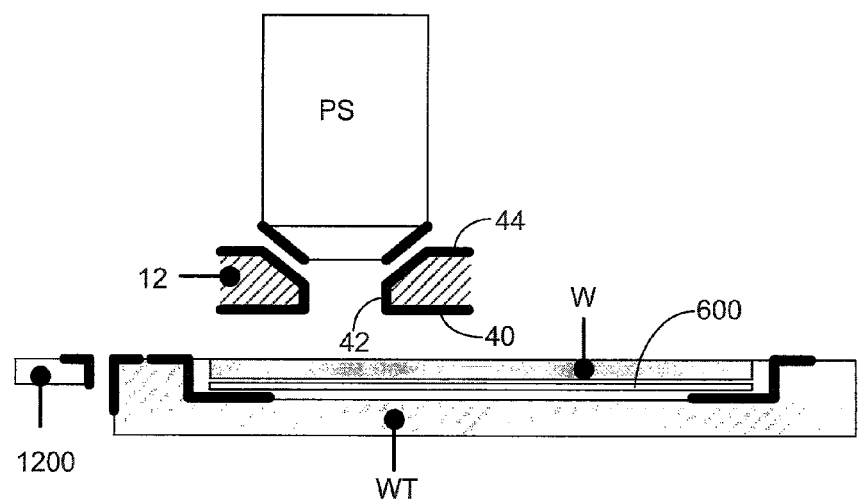
FIG. 22 is a schematic drawing, in cross-section, illustrating where heaters and/or temperature sensors may be placed.

The heaters 400 and/or temperature sensors 500 are described above as being applied to a surface of the substrate table WT adjacent a substrate W supporting area. However, an embodiment of the invention can be applied to any surface of a lithographic apparatus, particularly a projection apparatus, more particularly an immersion lithographic projection apparatus. FIGS. 21 and 22 illustrate various different locations at which heaters and/or temperature sensors 400, 500 might be placed in a lithographic apparatus.

FIG. 21 is a plan view of a substrate table WT. The position of heaters 400 and temperature sensors 500 adjacent the substrate supporting area have already been discussed. Other sites may be around any sensor 1000, particularly around the edge of any sensor 1000. This is because there may be a gap between the edge of a sensor 1000 and the edge of the substrate table WT which is held at an underpressure to remove liquid from the gap and thereby can see a high evaporation loss. The sensor 100 may be a transmission image sensor (TIS) or an ILIAS sensor, for example. Another area may be a drain around a dummy substrate 1100. The dummy substrate 1100 is used to close the bottom of a fluid handling system 12, during, for example, substrate swap, by positioning the dummy substrate 1100 under the projection system PS. Thereby the fluid handling system 12 may be maintained on during, for example, substrate swap which is advantageous in terms of avoiding drying stains on the final element of the projection system PS. Another way in which it is possible to maintain the fluid handling system 12 operational during, for example, substrate swap is to provide a swap bridge 1200 on the substrate table WT. The swap bridge 1200 is a surface which extends from the substrate table WT (optionally retractably) and provides a surface which can move under the fluid handling system 12 while, for example, a new second substrate table WT replaces the first substrate table WT. A gap between the top surface of the substrate table WT and a top surface of the swap bridge 1200 may be provided with an under pressure source to remove any liquid which finds its way into the gap. This area may be provided with heaters and/or sensors described herein, as well as the top surface of the substrate table WT itself adjacent the swap bridge 1200. During, for example, substrate swap, the swap bridge 1200 engages with the second substrate table WT. A further area 1300 where a swap bridge 1200 will engage with a substrate table WT is also provided with an under pressure source to remove liquid between the gap between the swap bridge 1200 and substrate table WT. This area 1300 may be provided with a heater and/or temperature sensor described herein.

FIG. 22 shows those areas mentioned above as well as a fluid handling system 12 and a projection system PS. Surfaces of the fluid handling system 12 which may make use of the heaters and/or temperature sensors described herein include any surface which comes into contact with immersion liquid during use. These include an under surface 40 of the fluid handling system 12, an inside surface 42 which defines a space in which liquid is held between the final end of projection system PS and the substrate W, in use as well as a top surface 44. The top surface 44 may be in contact with immersion liquid and in particular with a meniscus of liquid extending between the fluid handling system 12 and the final element of the projection system PS. As the position of that meniscus on the top surface 44 moves, evaporational loads can be applied to the top surface 44 so that heaters and/or temperature sensors may usefully be placed there. For similar reasons, heaters and/or temperature sensors may be placed around the edge of the projection system PS where the meniscus between the projection system PS and the fluid handling system 12 may be positioned or where splashes may occur. For example, the heaters and/or temperature sensors may be placed around the outer edge of a final element of the projection system PS.

Figure 24:
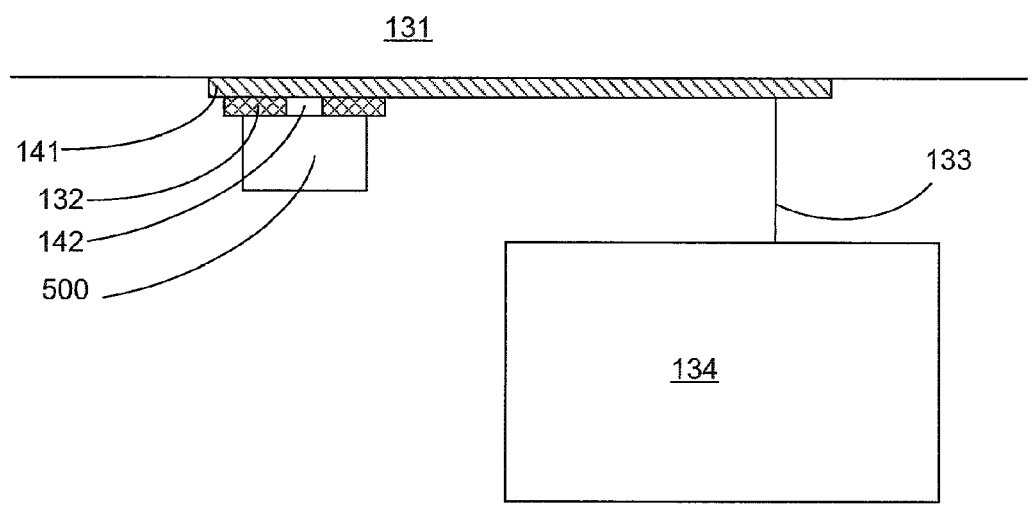
FIG. 24 is a schematic side-view drawing illustrating a temperature sensor.
Figure 25:
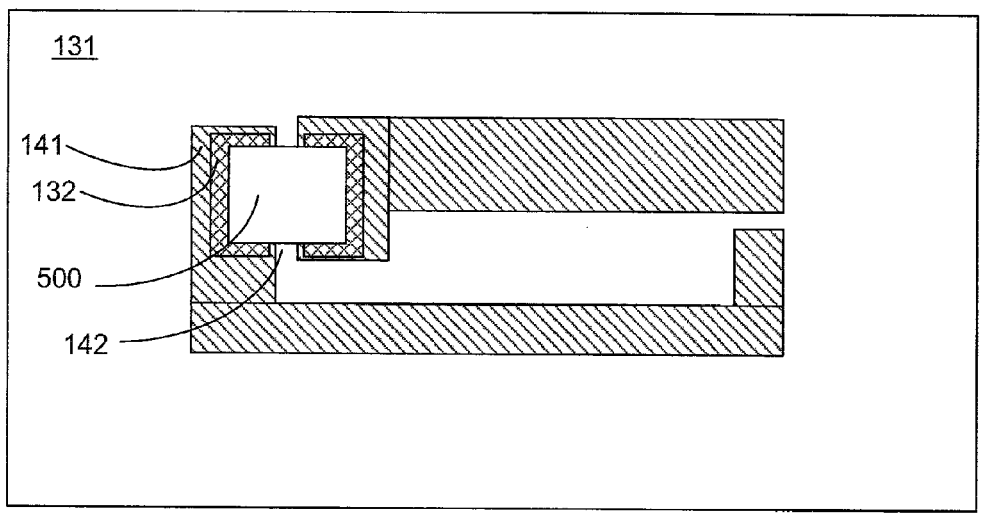
FIG. 25 is a schematic drawing, in plan, illustrating the temperature sensor of FIG. 24.

The thin film heaters 400 described above may be combined with temperature sensors that measure the temperature of a single point on a surface, rather than take an average of a temperature over a portion of the surface. For example, FIGS. 23, 24 and 25 depict a temperature sensor that is configured to measure the temperature of a single point on a surface that may be used according to an embodiment of the present invention.

Figure 23:
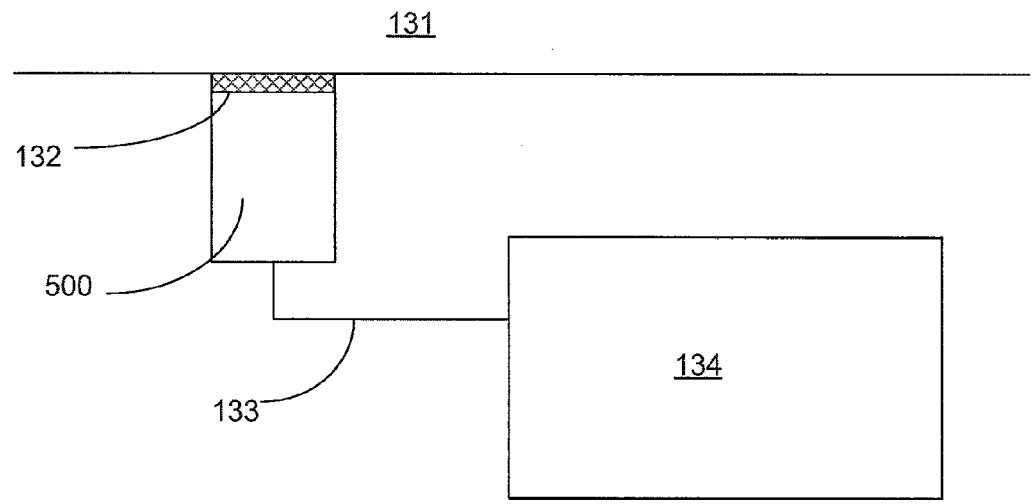
FIG. 23 is a schematic side-view drawing illustrating a temperature sensor.

FIG. 23 depicts an embodiment of the invention. FIG. 23 depicts how a temperature sensor 500 may be attached to the channel 200 or to the substrate table WT. The part to which the temperature sensor 500 is attached is given the reference numeral 131. The temperature sensor 500 is configured to measure the temperature of the part 131. The part 131 may be, for example, the channel 200 or the substrate table WT. However, part 131 may be any surface of the lithographic apparatus. The temperature sensor 500 is on the surface of the part 131. The temperature sensor 500 is attached to the surface by a thermally conductive paste 132.

The temperature sensor 500 may comprise a thermistor, or other thermometer equipment. According to the construction depicted in FIG. 23, the temperature sensor 500 is pressed directly against the part 131. The thermally conductive paste 132 may be provided intermediate the temperature sensor 500 and the part 131. The paste may be heat conductive glue. The temperature sensor 500 is connected to an electrical assembly 134 via at least one lead 133. The electrical assembly 134 takes temperature readings from the temperature sensor 500. The electrical assembly 134 may be a PCB.

In an embodiment, the temperature sensor 500 is mounted directly onto the electrical assembly 134 without the need of the lead 133.

A drawback of the construction depicted in FIG. 23 is that it can be difficult to position the temperature sensor 500 at the precise location where it is desired to measure the temperature. This is partly due to the presence of the electrical assembly 134 on which the temperature sensor 500 is mounted, or the presence of the lead 133 connecting the temperature sensor 500 to the electrical assembly 134. A further drawback is that the lead 133 puts pressure on the temperature sensor 500. This can undesirably affect temperature measurement taken by the temperature sensor.

The temperature sensor 500 may be made of a semiconductor material. The temperature sensor 500 is configured to measure the temperature at a single location.

FIGS. 24 and 25 depict an alternative to the construction of FIG. 23 for attaching the temperature sensor 500 to a part 131. FIG. 24 depicts a side view of the construction. FIG. 25 depicts a plan view of the construction.

The temperature sensor 500, which may be a thermistor, is attached to the part 131 at the location at which the temperature is to be measured. At this location, the part 131 is coated with an electrically conductive coating 141. The temperature sensor 500 is connected to the electrical assembly 134 via the coating 141. The temperature sensor 500 is on the surface of the part 131. The temperature sensor 500 is connected to the surface via the coating 141. In an embodiment, the temperature sensor 500 is connected to the surface via the coating 141 and a layer of glue 132.

Desirably, the electrically conductive coating is thermally conductive. As is most clearly seen in FIG. 25, the electrically conductive coating 141 takes the form of a pattern. The purpose of the pattern of the coating 141 is to allow the electrically conductive coating 141 to be connected to the electrical assembly 134 at an appropriate position. For example, an appropriate position may be where there is more space for the electrical assembly 134 or for the lead 133 to connect to the electrical assembly 134. For this purpose, the coating 141 may comprise at least one elongate portion.

The electrically conductive coating 141 also provides electrical shielding to the part 131 and/or to the temperature sensor 500. In this way, electrical shielding can be provided without any additional production steps. Measurement signals from the temperature sensor 500 can be read out via the electrical assembly 134, which may be connected directly to the coating 141, or indirectly via a lead 133.

The temperature sensor 500 may be attached directly to the coating 141. The temperature sensor 500 may be embedded within the coating 141. In an embodiment, the temperature sensor 500 is connected to a coating 141 via a bonding layer 132. The bonding layer 132 may be formed of a thermally conductive adhesive (i.e. glue). The bonding layer 132 may be formed of a material for soldering. Desirably, the bonding layer 132 is less than 10 μm thick.

A gap 142 may be provided between the temperature sensor 500 and the coating 141. The purpose of the gap 142 is to prevent short-circuiting. The coating 141 is formed of two coating sections. Each section acts as an electrode to provide power to the temperature sensor 500 and/or receive signals from the temperature sensor 500. The gap 142 separates the two coating sections from each other. The gap 142 may be filled with an electrically insulating material.

The thickness of the coating is less than 10 μm, less than 5 μm, less than 3 μm, or between 0.2 and 2.0 μm.

The electrically conductive coating 141 may be made of platinum, or a predominately platinum alloy, for example. The coating 141 may comprise at least one of copper, aluminum, silver and gold.

The same principle of use a coating 141 as an intermediary between the electrical assembly 134 and the temperature sensor 500 may be used in the context of a heater 400 instead of the temperature sensor 500.

In an embodiment, the bonding layer 132 is not present. The temperature sensor 500 may be deposited as a coating. In an embodiment, the coating 141 and the temperature sensor 500 may have positions that are interchanged from the positions described above. The temperature sensor 500 may attach to the part 131 directly.

Although an embodiment of the present invention has been described above with reference to an immersion lithographic apparatus, this need not necessarily be the case. Other types of lithographic apparatus may suffer from uneven cooling (or heating) around the edge of a substrate. For example, in an EUV apparatus (extreme ultra-violet apparatus) heating due to the impingement of the projection beam can occur. This can give a localized heating to the substrate rather in the same way as the passage of the edge of substrate under the localized liquid supply system can give a cooling effect. If the heat transfer fluid in the channel 200 is given a small negative temperature offset with respect to the desired temperature in a normal operating condition, all the heaters can be on to obtain the desired temperature. A local cooling load can then be applied by switching a heater off In this circumstance it may be that the localization of the heaters only at the edge of the substrate is too limited and that heaters may be additionally or alternatively be placed at different radial distances from the center of the substrate supporting area. However, the same principles as described above apply in this case also.

Therefore, as can be seen, an embodiment of the present invention can be implemented in many types of immersion lithographic apparatus. For example, an embodiment of the invention may be implemented in an I-line lithographic apparatus.

In an aspect, there is provided a lithographic apparatus comprising a heater and/or temperature sensor on a surface.

In an embodiment, the surface is a surface of at least one selected from: a substrate table configured to support a substrate on a substrate supporting area, a fluid handling system, a projection system, a surface of a grating or a sensor of a positional measurement device, and/or a swap bridge.

In an embodiment, the surface is a surface on a substrate table configured to support a substrate on a substrate supporting area which is: adjacent the substrate supporting area, or adjacent a sensor or adjacent a swap bridge.

In an embodiment, the lithographic apparatus further comprises a burl plate to support the substrate, wherein the surface on which the heater and/or temperature sensor is formed is a surface of the burl plate.

In an embodiment, the heater and/or temperature sensor is formed on the burl plate between the burls.

In an embodiment, the surface is a surface of a final element of a projection system.

In an embodiment, the heater and/or temperature sensor is a thin film heater and/or temperature sensor.

In an embodiment, the heater and/or temperature sensor is directly bonded to the surface without use of an adhesive.

In an embodiment, the heater and/or temperature sensor is formed, in plan, as a line following a tortuous path.

In an embodiment, the heater and/or temperature sensor is formed of platinum

In an embodiment, the temperature sensor is connected to an electrical assembly to read measurements from the channel temperature sensor indirectly via an electrically conductive coating on the component to which the temperature sensor is applied.

In an aspect, there is provided a lithographic projection apparatus comprising a substrate table configured to support a substrate on a substrate supporting area, the substrate table comprising a plurality of heaters and/or temperature sensors adjacent a central portion of the substrate supporting area, the plurality of heaters and/or sensors being elongate.

In an embodiment, the plurality of heaters and/or sensors are elongate in substantially parallel directions.

In an embodiment, the plurality of heaters and/or sensors extend across the substrate supporting area from one edge to an opposite edge.

In an embodiment, the plurality of heaters are elongate in a first direction such that the length of time a given heater and/or temperature sensor is under a projection system during imaging of a substrate is greater than if the heater and/or sensor were oriented with its elongate direction perpendicular to the first direction.

In an embodiment, the first direction is such that the length of time is maximized.

In an embodiment, the plurality of heaters and/or temperature sensors are comprised of a thin film.

In an embodiment, the lithographic apparatus further comprises a burl plate to support the substrate and wherein the plurality of heaters and/or temperature sensors are formed on a surface of the burl plate.

In an embodiment, the plurality of heaters and/or temperature sensors are formed on the burl plate between the burls.

In an embodiment, the plurality of heaters and/or temperature sensors are positioned on the top and/or bottom of the burl plate.

In an embodiment, the plurality of heaters and/or temperature sensors are comprised of a line of material, in plan, which meanders in a tortuous path, in plan.

In an embodiment, the substrate table further comprises plurality of edge heaters adjacent different portions of an edge of the substrate supporting area and/or a chamber in the substrate table containing a fluid in both gaseous and liquid phases and/or a passage adjacent the substrate supporting area for the passage of a thermal conditioning fluid therethrough.

In an embodiment, the substrate table comprises one heater and/or temperature sensor per die on the substrate.

In an embodiment, the lithographic apparatus comprises a plurality of the heaters and a plurality of the temperature sensors.

In an embodiment, the plurality of heaters and plurality of temperature sensors are, in plan, laid out in a two dimensional grid.

In an embodiment, each heater is integrated with a corresponding temperature sensor.

In an embodiment, each of the plurality of heaters is associated with a corresponding one of the plurality of temperature sensors.

In an embodiment, a heater and an associated sensor form a self-regulating thermal system.

In an embodiment, the self-regulating thermal system is configured to activate or deactivate the heater due to local change in temperature.

In an embodiment, the heater and associated sensor form a micro-electro-mechanical system.

In an embodiment, the associated sensor comprises a thermally activated switch.

In an embodiment, the heater and associated sensor are a self-regulated heater having an electromagnetic property that varies as a function of temperature such that a change in temperature results in a change in heat output at constant applied voltage.

In an aspect, there is provided a lithographic apparatus comprising a substrate table configured to support a substrate on a substrate supporting area and comprising a heater and/or a temperature sensor which extends across the substrate supporting area from one edge to an opposite edge.

In an aspect, there is provided a lithographic apparatus comprising a heater and a temperature sensor integrated with each other.

In an embodiment, the heater and temperature sensor are formed on a surface.

In an embodiment, the lithographic apparatus further comprises a burl plate to support a substrate, and the surface on which the heater and temperature sensor are formed is a surface of the burl plate.

In an aspect, there is provided a substrate table configured to support a substrate on a substrate supporting area and a heater and/or temperature sensor on a surface adjacent the substrate supporting area.

In an aspect, there is provided a method of compensating for a local heat load in an immersion lithographic projection apparatus the method comprising controlling a heater or using a signal from a temperature sensor to compensate for a local heat load wherein the heater and/or temperature sensor is on a surface.

In an embodiment, the heater and associated sensor form a self-regulating thermal system.

In an aspect, there is provided a lithographic apparatus comprising an electrically conductive coating on a surface, and a heater and/or temperature sensor connected to the coating.

In an embodiment, an electrical assembly is electrically connected to the heater and/or temperature sensor via the coating.

In an embodiment, the heater and/or temperature sensor is connected to the coating by a bonding layer.

In an embodiment, the bonding layer comprises an adhesive.

In an embodiment, the bonding layer comprises a material for soldering.

In an embodiment, an electrically insulating gap is provided between the surface and the heater and/or temperature sensor.

In an embodiment, the heater and/or temperature sensor is embedded in the coating.

In an embodiment, the coating comprises at least one of platinum, copper, aluminum, silver, gold and a semiconductor material.

In an embodiment, the heater and/or temperature sensor is substantially wholly within the coating in plan view.

In an embodiment, the coating is patterned.

In an embodiment, the coating comprises at least one elongate portion.

In an embodiment, the coating is formed of at least two distinct coating sections.

In an embodiment, the coating is an electrode.

In an embodiment, the coating is configured to provide electrical power to, or receive electrical signals from, the heater and/or temperature sensor.

In an embodiment, a thickness of the coating is less than 10 μm, less than 5 μm, less than 3 μm, or less than 1 μm.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus comprising:
a substrate table configured to support a substrate on a substrate supporting area, the substrate table comprising a plurality of heaters and/or temperature sensors adjacent a central portion of the substrate supporting area, the plurality of heaters and/or sensors being elongate, and heater elements configured to receive electricity of the plurality of heaters overlaying a surface between burls of the substrate supporting area and being horizontally separated from the burls, and/or sensing elements of the plurality of temperature sensors overlaying a surface between burls of the substrate supporting area.

2. The lithographic apparatus of claim 1, wherein the plurality of heaters and/or sensors are elongate in substantially parallel directions.

3. The lithographic apparatus of claim 1, wherein the plurality of heaters and/or sensors extend across the substrate supporting area from one edge to an opposite edge.

4. The lithographic apparatus of claim 1, wherein the plurality of heaters are elongate in a first direction such that the length of time a given heater and/or temperature sensor is under a projection system during imaging of a substrate is greater than if the heater and/or sensor were oriented with its elongate direction perpendicular to the first direction.

5. The lithographic apparatus of claim 4, wherein the first direction is such that the length of time is maximized.

6. The lithographic apparatus of claim 1, wherein the heater elements of the plurality of heaters and/or the sensing elements of the temperature sensors are comprised of a thin film.

7. The lithographic apparatus of claim 1, wherein the heater element of each of the plurality of heaters and/or the sensing element of each of the temperature sensors comprises a line of material, in plan, which meanders in a tortuous path, in plan.

8. The lithographic apparatus of claim 1, wherein the substrate table further comprises a plurality of edge heaters adjacent (I) different portions of an edge of the substrate supporting area, or (ii) a chamber in the substrate table containing a fluid in both gaseous and liquid phases, or (iii) a passage adjacent the substrate supporting area for the passage of a thermal conditioning fluid therethrough, or (iv) any combination selected from (i)-(iii).

9. The lithographic apparatus of claim 1, wherein the substrate table comprises one heater and/or temperature sensor per die on the substrate.

10. The lithographic apparatus of claim 1, comprising a plurality of the heaters and a plurality of the temperature sensors.

11. The lithographic apparatus of claim 10, wherein the plurality of heaters and plurality of temperature sensors are, in plan, laid out in a two dimensional grid.

12. The lithographic apparatus of claim 10, wherein each heater is integrated with a corresponding temperature sensor.

13. The lithographic apparatus of claim 10, wherein each of the plurality of heaters is associated with a corresponding one of the plurality of temperature sensors.

14. The lithographic apparatus of claim 13, wherein a heater and an associated sensor form a self-regulating thermal system.

15. The lithographic apparatus of claim 14, wherein the self-regulating thermal system is configured to activate or deactivate the heater due to local change in temperature.

16. The lithographic apparatus of claim 14, wherein the heater and associated sensor form a micro-electro-mechanical system.

17. The lithographic apparatus of claim 16, wherein the associated sensor comprises a thermally activated switch.

18. The lithographic apparatus of claim 14, wherein the heater and associated sensor are a self-regulated heater having an electromagnetic property that varies as a function of temperature such that a change in temperature results in a change in heat output at constant applied voltage.

19. A lithographic apparatus comprising:
a substrate table configured to support a substrate on a substrate supporting area; and
a heater and/or a temperature sensor which extends across the substrate supporting area from one edge to an opposite edge, a heater element configured to receive electricity of the heater overlaying a surface of the substrate supporting area between burl parts of the substrate supporting area and being horizontally separated from the burl parts and/or a sensing element of the temperature sensor overlaying a surface of the substrate supporting area between burl parts of the substrate supporting area and being horizontally separated from the burl parts.

20. The lithographic apparatus of claim 19, wherein the heater element and/or sensing element are formed on the surface as a thin film.

21. A lithographic apparatus comprising:
a substrate table configured to support a substrate on a substrate supporting area; and
a heater and a temperature sensor integrated with each other, a heater element configured to receive electricity of the heater overlaying a surface of the substrate supporting area between burl parts of the substrate supporting area and being horizontally separated from the burl parts and a sensing element of the temperature sensor overlaying a surface of the substrate supporting area between burl parts of the substrate supporting area.

22. The lithographic apparatus of claim 21, wherein the heater element of the heater and the sensing element of the temperature sensor are formed on a surface.

23. The lithographic apparatus of claim 22, wherein the heater element and the sensing element are formed as a thin film.

24. A substrate table configured to support a substrate on a substrate supporting area, the substrate table comprising a heater element of a heater, the heater element configured to receive electricity and overlaying a surface between burl parts of the substrate supporting area, the heater element located at a position horizontally separated from the burl parts, and/or the substrate table comprising a sensing element of a temperature sensor overlaying a surface between burl parts of the substrate supporting area and being horizontally separated from the burl parts.

25. The substrate table of claim 24, wherein the heater element and/or sensing element are formed on the surface as a thin film.

26. The substrate table of claim 25, wherein the heater element and the sensing element are integrated with each other.

* * * * *